United States Patent [19]
Wilson et al.

[11] 4,229,694
[45] Oct. 21, 1980

[54] POWER ANGLE RELAY TO MEASURE AND RESPOND TO THE POWER ANGLE OF A SYNCHRONOUS GENERATOR

[76] Inventors: Gerald L. Wilson, 29 Highgate Rd., Wayland, Mass. 01778; David M. Otten, 50 Playstead Rd., Newton, Mass. 02166

[21] Appl. No.: 931,739

[22] Filed: Aug. 7, 1978

[51] Int. Cl.³ .................. G01R 31/00; H02H 7/06
[52] U.S. Cl. .................... 324/158 MG; 361/20
[58] Field of Search .............. 324/158 MG, 83 FM; 361/20, 23; 322/99

[56] References Cited
PUBLICATIONS

Power Angle Relay; Apr. 1978; Wiln-Otte, Inc., 29 Highgate Rd., Wayland, Mass. 01778.
Prewett, J. N.; "Method of Measuring . . ."; Proc. of the I.E.E.; Part C; Apr. 1958; pp. 605–608.

*Primary Examiner*—Ernest F. Karlsen

[57] ABSTRACT

A power angle relay to measure the power angle of a synchronous alternator. The power angle relay receives a reference voltage signal corresponding to a fixed point on a reference voltage waveform (usually a zero crossing) from some point in the power system to which the alternator is normally synchronized and an electric signal representative of the angular position of the shaft of the synchronous alternator and is operable to combine the two to provide an indication representative of the power angle between the direct axis of the synchronous alternator and said fixed point.

43 Claims, 13 Drawing Figures

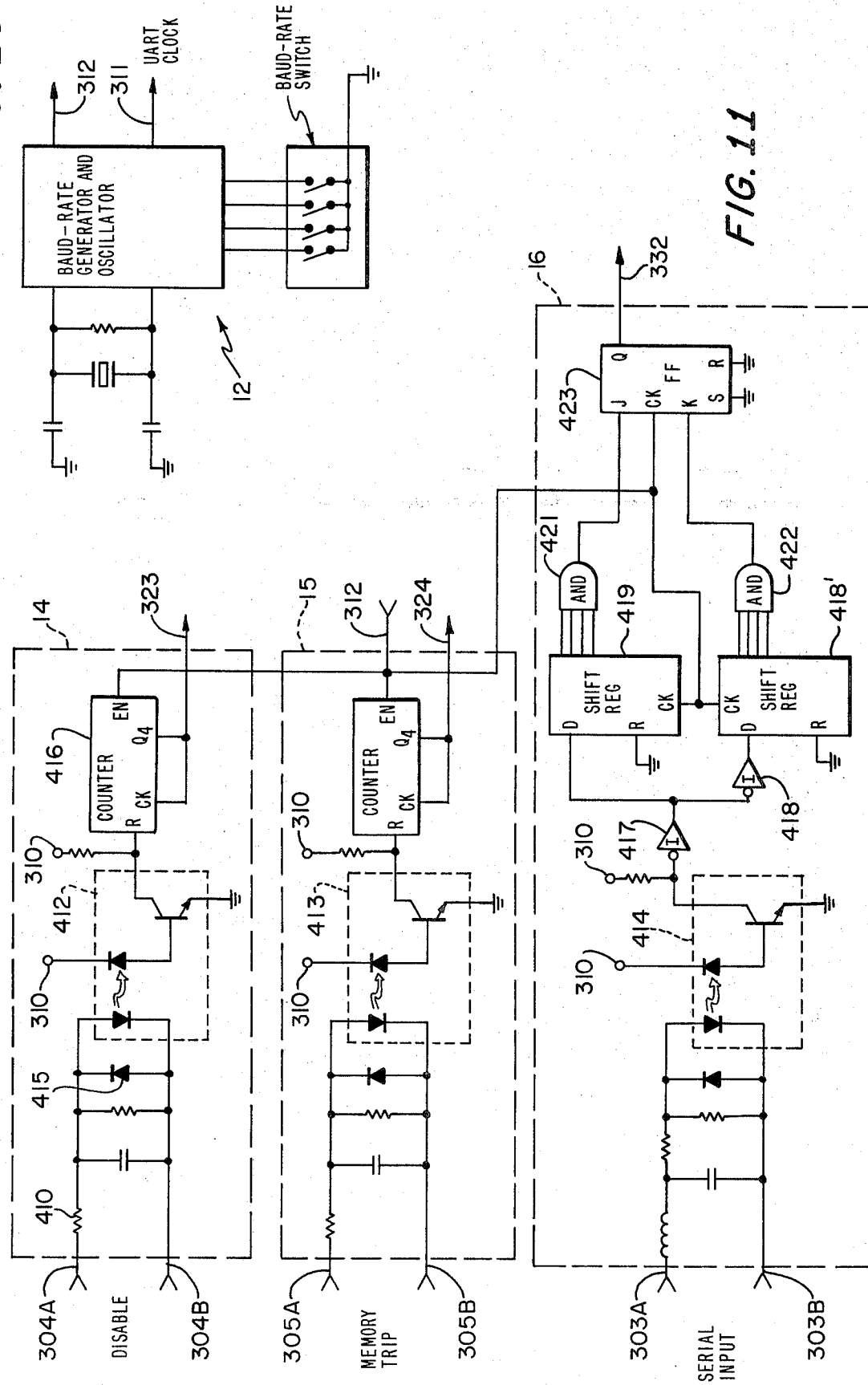

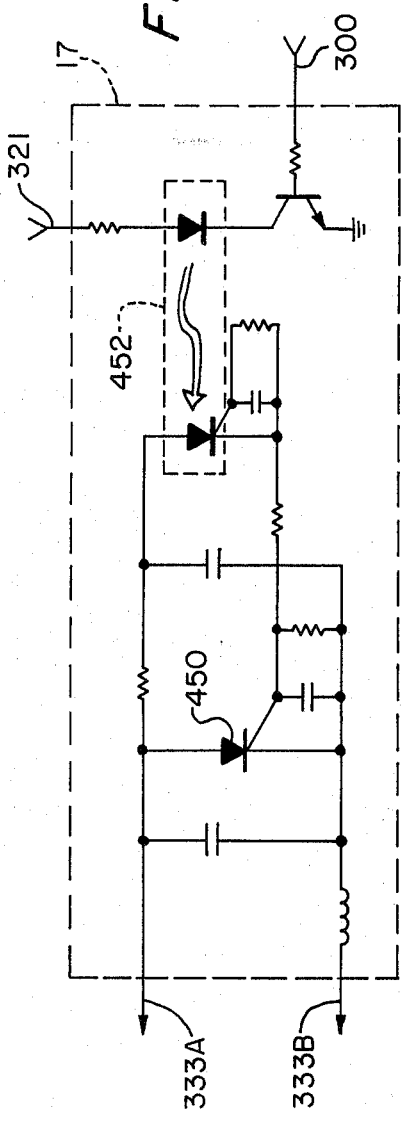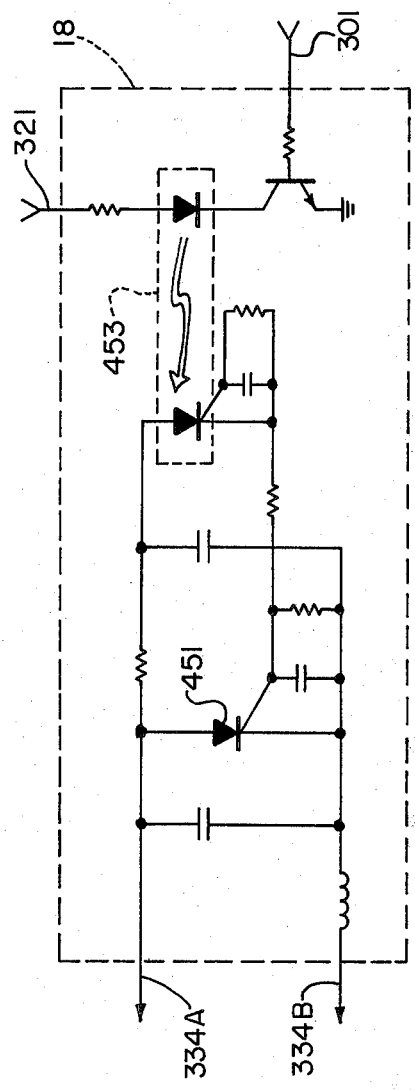

POWER ANGLE RELAY TO MEASURE AND RESPOND TO THE POWER ANGLE OF A SYNCHRONOUS GENERATOR

The present invention relates to devices to measure the power angle between the direct axis of a synchronous alternator and a reference voltage and to systems embodying said devices.

A very serious problem in electric power generation in connection with the ever-increasingly-sized power grids of the electric utility systems is that of determining dangerous overload on the large (i.e., megawatt) synchronous alternators of the systems. One way of sensing load on a synchronous alternator and, hence, the occurrence of overload or impending overload, is to measure the angle (called the "power angle") between the alternator rotor and an external reference voltage, which angle is used to describe the steady-state and transient stability of a synchronous alternator while connected to an electric system. The power angle, and changes therein, can be measured and evaluated using the power angle relay herein described. The power angle relay taken up in great detail hereinafter is one that has been built and tested; in order to limit to some extent, the test hereof, there accompanies herewith a writing, by the present inventors entitled *POWER ANGLE RELAY* (April 1978) which describes an actual device and gives actual values. The writing is drawn upon heavily hereinafter and is hereby incorporated herein by reference.

The power angle relay of the present invention provides to a plant operator a clear indication of the unit power angle in relation to the maximum angle for stability. It can be used to alert the operator when the unit is operating near unstable conditions such as those that arise due to underexcitation or poor external transmission conditions. It therefore enables the operator to take corrective action before the unstable condition is reached.

The power angle relay disclosed provides a measure of the power angle before, during, and after any trip condition. This output is supplied in analog form for use with unit oscillographs or in digital form for use with in-plant processing computers. A memory internal to the device, stores power angle data prior to and after a disturbance. This output can be fed to either an in-plant computer or to an optional printer, thus providing a power-angle record of events just prior to and during the transient. These various outputs are useful to the engineer or operator for analysis of conditions after an alternator tripping sequence. They provide a system planner with field data of alternator power angles and thus the opportunity to evaluate transient stability and load-flow programs.

The power angle relay provides the flexibility required for a variety of alarming and tripping schemes. A set point is available for maximum power angle. A minimum power angle set point can be, and in the actual device, is, hard wired in the device. In addition, a slip-rate set-point is provided. All of these relaying functions may be used to provide pole-slip protection during steady-state and transient conditions. Each function provides a trip circuit with seal-in and targets.

As above indicated, the explanation herein is made with respect to an actual device to measure the power angle and, in some instances, actual circuit values as they relate to that actual device are included to place the explanation in context. It is not intended, however, that the broad concepts of the power angle relay of the present invention be in any way limited by this approach.

In what follows, mention is made to deriving the power angle in terms of a reference voltage. The "reference voltage" herein in the broadest context can be derived from any voltage which is normally in synchronism with the alternator.

Accordingly, it is a principal object of the present invention to provide a power angle relay or device to measure the power angle between the direct axis of a synchronous alternator and the time-phase of a reference voltage waveform.

Another object is to provide a power angle relay that is dependable and which embodies safeguards against false indications.

Still another object is to provide a power angle relay that can be, with facility, incorporated in existing utility systems.

A further object is to provide a system in which the power angle relay serves as an element for the determination of said power angle.

These and still further objects are addressed hereinafter.

The foregoing objects are achieved, generally, in a power angle relay to measure and evaluate the power angle of a synchronous alternator, which power angle relay receives a reference voltage corresponding to a fixed point on a voltage waveform from some point in the system to which the alternator is normally synchronized and an electric signal representative of the angular position of the shaft of the synchronous alternator and processes the two to provide a signal or indication representative of the power angle between the direct axis of the synchronous alternator and said fixed point. Typically, the shaft position signal is recorded by a shaft position detector that provides the signal with each rotation of the shaft; the fixed point on the voltage waveform is typically a zero crossing thereof that is detected and used as a timing signal in the detector.

The invention is hereinafter described with reference to the drawing in which:

FIG. 10 shows schematically the circuitry labeled "Clock" in FIG. 2;

FIG. 11 shows schematically the circuitry labeled "Signal Conditioning Circuit #3," "Circuit Conditioning Circuit #4," and "Circuit Conditioning Circuit #5"; and FIGS. 12A and 12B show schematically the two blocks labeled "Contacts" in FIG. 2.

Figure 1:
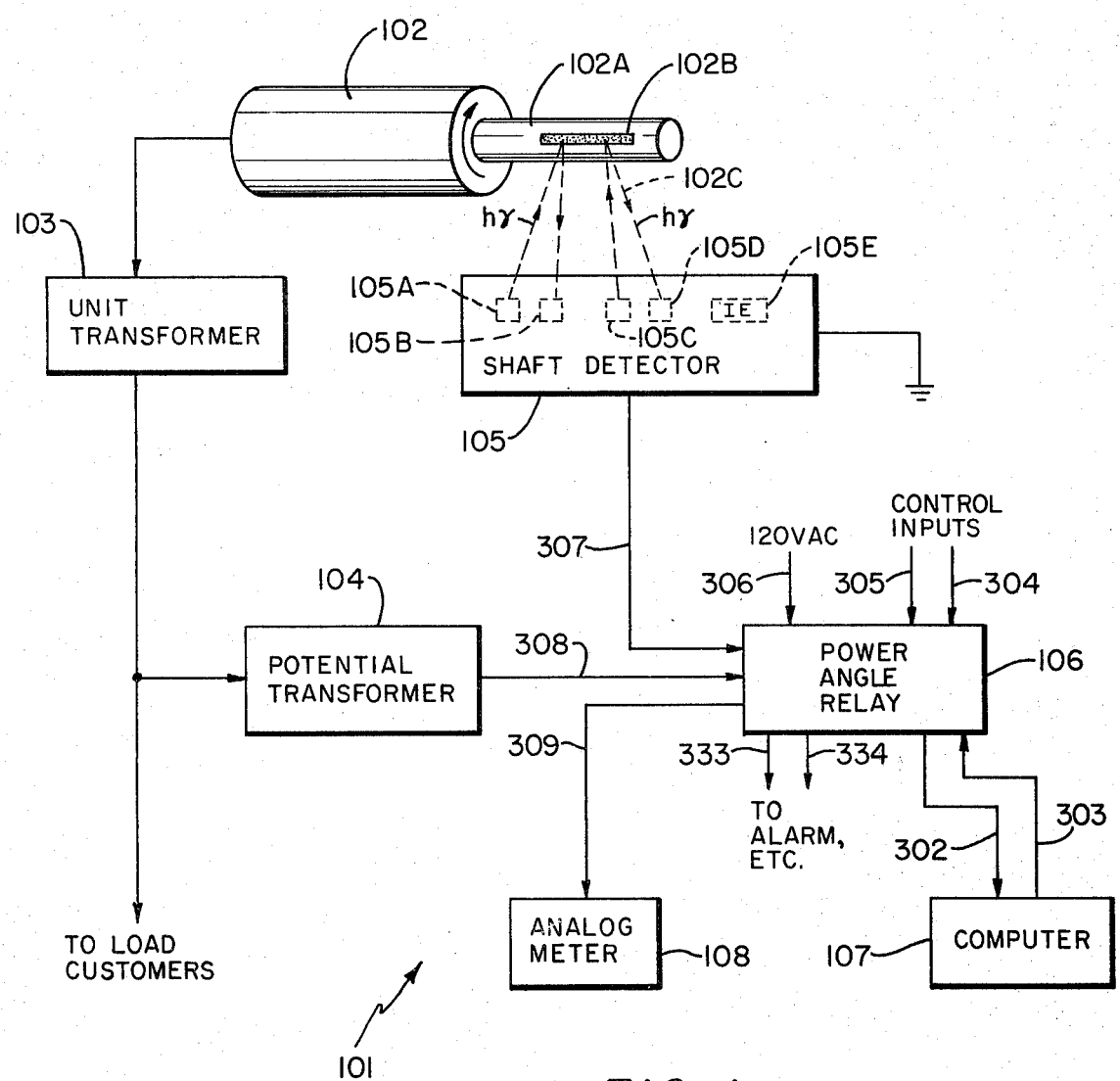
FIG. 1 is a diagrammatic representation of an electric power system that includes a synchronous alternator and a power angle relay to measure the power angle between the axis of the synchronous alternator and the terminal voltage of the synchronous alternator.
Figure 2:
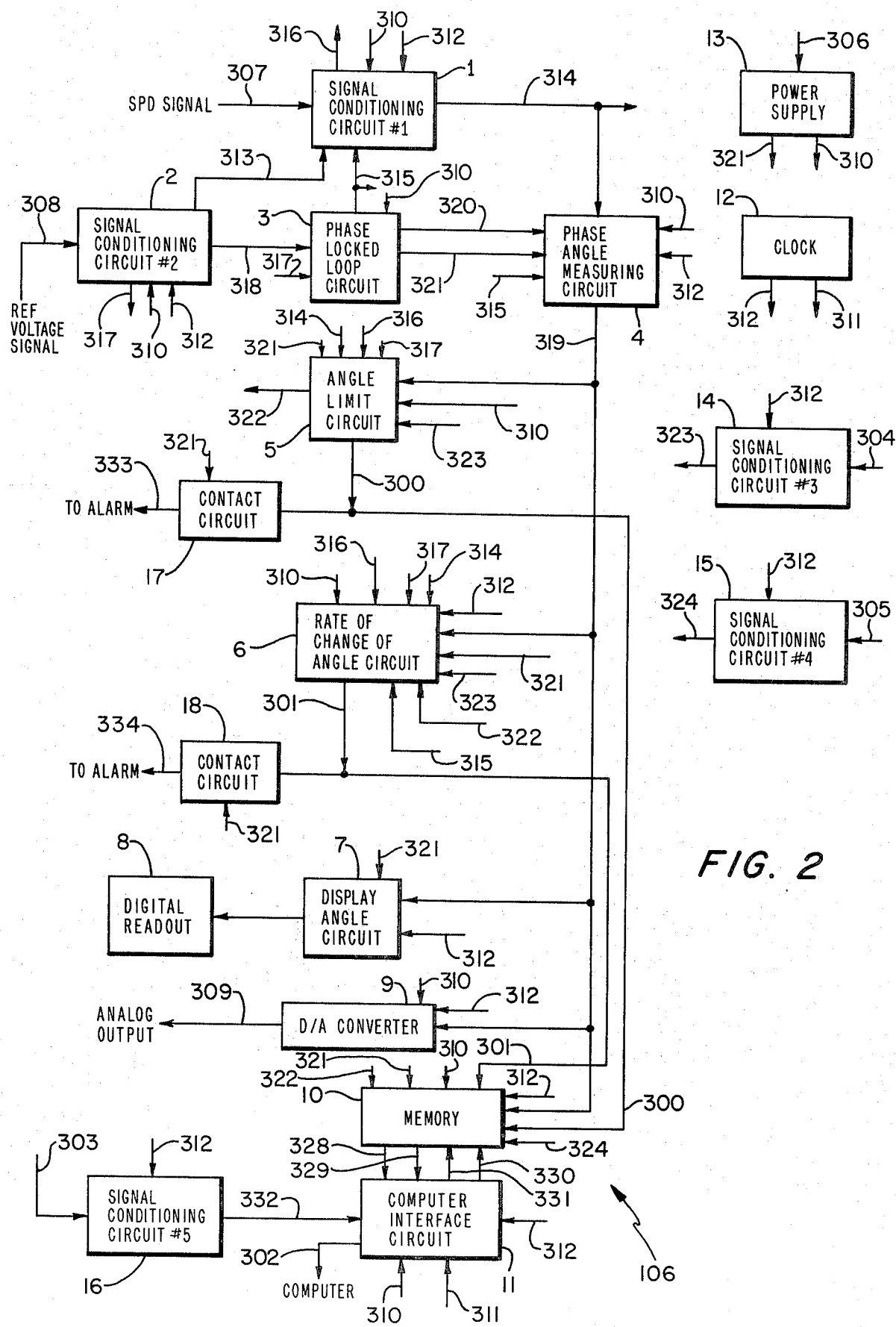
FIG. 2 shows in block diagram form a preferred embodiment of the power angle relay.

Turning now to FIG. 1, there is shown at 101 an electric power system that includes a synchronous alternator 102 and a power angle relay 106 to measure the power angle between the direct axis of the synchronous alternator and the time-phase of reference voltage waveform related to the terminal voltage of the alternator. The power angle relay 106 is described in great detail hereinafter, but for now, briefly, it receives a reference voltage from a potential transformer 104 (the reference voltage corresponds to a fixed point, usually a zero croing, on the voltage waveform of the power system 101 to which the synchronous alternator 102 is normally synchronized) and an electric signal (also called "shaft position detector signal" or "tach signal" or "SPD signal" herein) from a shaft detector 105 (the electric signal is representative of the angular position of the shaft shown at 102A of the synchronous alternator 102) and processes the two (i.e., the reference voltage and the electric signal or SPD signal) to provide a signal or indication representative of the power angle between the direct axis of the synchronous alternator and its terminal voltage. As is noted elsewhere herein, the reference voltage is not taken directly from the alternator terminals, but is, rather, taken from a remote point; in fact, the reference voltage is taken from the terminals of a step-up or unit transformer 103 through the potential transformer 104 which reduces the voltage to a level (usually 120 volts) that can be used by the power angle relay 106. The shaft detector 105 senses passage of a mark 102B in the shaft 102A and, hence, notes passage of that mark. In the explanation below, it is shown that the power angle relay 106 serves to compare the time of zero crossing of the reference voltage waveform with the time that the mark 102B passes the detector 105, and it is the comparison of the two times which serves to provide the power angle as well as changes in the power angle. The power angle (and changes therein), thus derived, serves as a basis for further action. The alternator 102 can be removed (i.e., tripped) from the system; electric load can be dropped; an alarm can be sounded, and so forth. Since the consequences of an unfavorable output signal from the power angle relay can be substantial, it is essential, for present purposes, that such output truly represent the power angle and not be subject to false readings. As the description unfolds, the various safeguards to prevent false readings, as well as to provide true readings, are pointed out. In the description, an attempt is made to apply the same or similar descriptions to circuit elements that serve the same or similar functions in the system 101. For example, in the figures the numerals 300–324 and 328–334 are used to designate conductors in FIG. 2 wherein the single conductors shown may, in fact, represent more than one conductor; thus, in later figures, letters are added to a numeral to show a multiple-conductor input or output. For example, the conductor labeled 319 in FIG. 2 is shown as ten conductors 319A–319J in other figures. Not all conductors are expressly taken up in the description.

A great deal of the circuitry of the power angle relay 106 is digital in nature; hence, signal conditioning to provide proper signal shapes is required. In FIG. 2, such signal conditioning is done by signal conditioning circuits #1–#5 that are designated 1, 2, 14, 15 and 16, respectively. The reference voltage waveform from the potential transformer 104 is connected along conductor 308 as input to the signal conditioning circuit 2 and the electric signal representative of the angular position of the shaft 102A is connected along conductor 307 as input to the signal conditioning circuit 1. The two signals, that is, the reference voltage and the electric signal, as later discussed in greater detail, are connected as input to a phase angle measuring circuit 4 which combines the two to provide an output signal (at the conductor 319) or other indication representative of the power angle between the direct axis of the synchronous alternator and the reference voltage waveform. (It will be appreciated that the power angle measured is based on the time relationship between the reference voltage waveform on the conductor 308 and the SPD signal on the conductor 307 in FIG. 1 but that the two actual signals provided as input to the circuit 4 are the reference voltage and the electric signal respectively from the circuits 3 and 1 in FIG. 2.) A power supply 13 provides an unregulated dc (typically +10 volts) output on conductor 321 and a regulated (typically +12 volts) output on conductor 310. A clock 12 provides clock signals on conductors 311 and 312 which are respectively the baud rate clock later discussed and 307 kHz in the actual apparatus.

The circuitry in FIG. 2 is discussed briefly in this paragraph and in greater detail hereinafter. Inputs to the power angle measuring circuit 4 come from the signal conditioning circuit 2 through a phase-locked loop circuit 3 and from the signal conditioning circuit 1. The ten outputs 319A–319J of the phase angle measuring circuit 4 provide the information which is evaluated and acted upon by the further circuitry in FIG. 2. Details as to the further circuitry of FIG. 2 and the operation thereof is taken up later; for now it suffices to say that the outputs 319–319J are connected as input to an angle limit circuit 5, a rate of change of angle circuit 6, a display angle circuit 7, a digital-to-analog converter 9 and a memory 10. The computer 107 in FIG. 1 interfaces with the relay 106 through a computer interface 11 in FIG. 2. Contact circuits or trip circuits 17 and 18 provide switching functions to control alarms or the like and a digital readout 8 is provided. A general discussion of the system 101 of FIG. 1 and, more particularly, the relay circuitry of FIG. 2 now follows.

The basic relay 106 consists of a circuit, i.e., the phase-locked loop circuit 3, whose output frequency (i.e., clock pulses on conductor 315 at 3600 times the frequency of the voltage waveform from which the reference voltage is derived in the actual device described here) is locked to that of a reference voltage waveform, usually obtained from potential transformers (i.e., the potential transformer or transformers 104 in FIG. 1) on the high side of the unit transformer 103 or to some other reference voltage waveform, as above explained. A second signal, the SPD signal, is obtained from the shaft position detector 105 which generates a pulse for each rotation of the shaft. By employing offset circuitry in circuit 4 of FIG. 2, the difference in time between a zero crossing of the reference voltage waveform and the arrival of the shaft position detector pulse or signal is made directly proportional to the power angle.

The power angle relay 106 samples this angle once for ech rotation of a two pole generator. Both digital and analog output formats are provided in the relay 106. The digital output is displayed on the front of the relay on the digital readout 8. In addition, digital output at 302 in FIG. 2 is available in serial format at a set of terminals for use as an interface to an in-plant computer or to an optional thermal printer. The analog output at 309 in FIG. 2 can be displayed on an indicating panel meter or fed to an auxiliary in-plant device such as an oscillograph. Both the digital and analog outputs display the power angle in the range from −180° to +180°.

Figure 5:
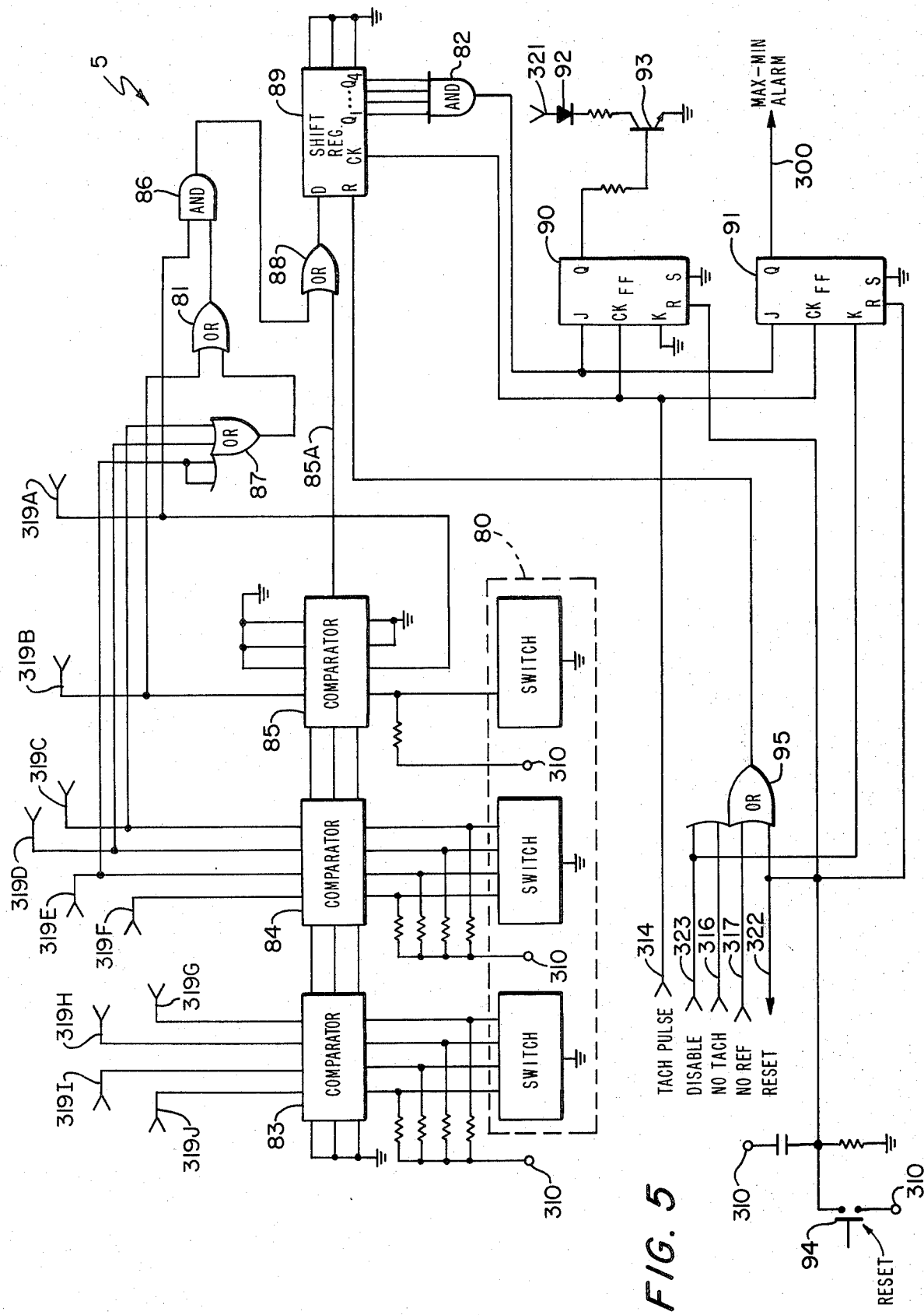
FIG. 5 shows schematically the circuitry in the block labeled "Angle Limit Circuit" in FIG. 2.

The value of the power angle is compared with a maximum value set by front panel thumbwheel switches 80 in FIG. 5, as later discussed herein. The maximum angle can be set for any positive angle. A minimum angle of −20° is incorporated in the relay 106. If the power angle exceeds the maximum setting or is less than the minimum setting for four consecutive samples or rotations of the alternator shaft, and SCR 450 in FIG. 12A in the contact circuit 17 conducts providing effectively, a pair of closed contacts, and a target lamp 92 in FIG. 5 is energized. Both the SCR 450 and the target lamp 92 remain "on" until they are reset.

Figure 6:
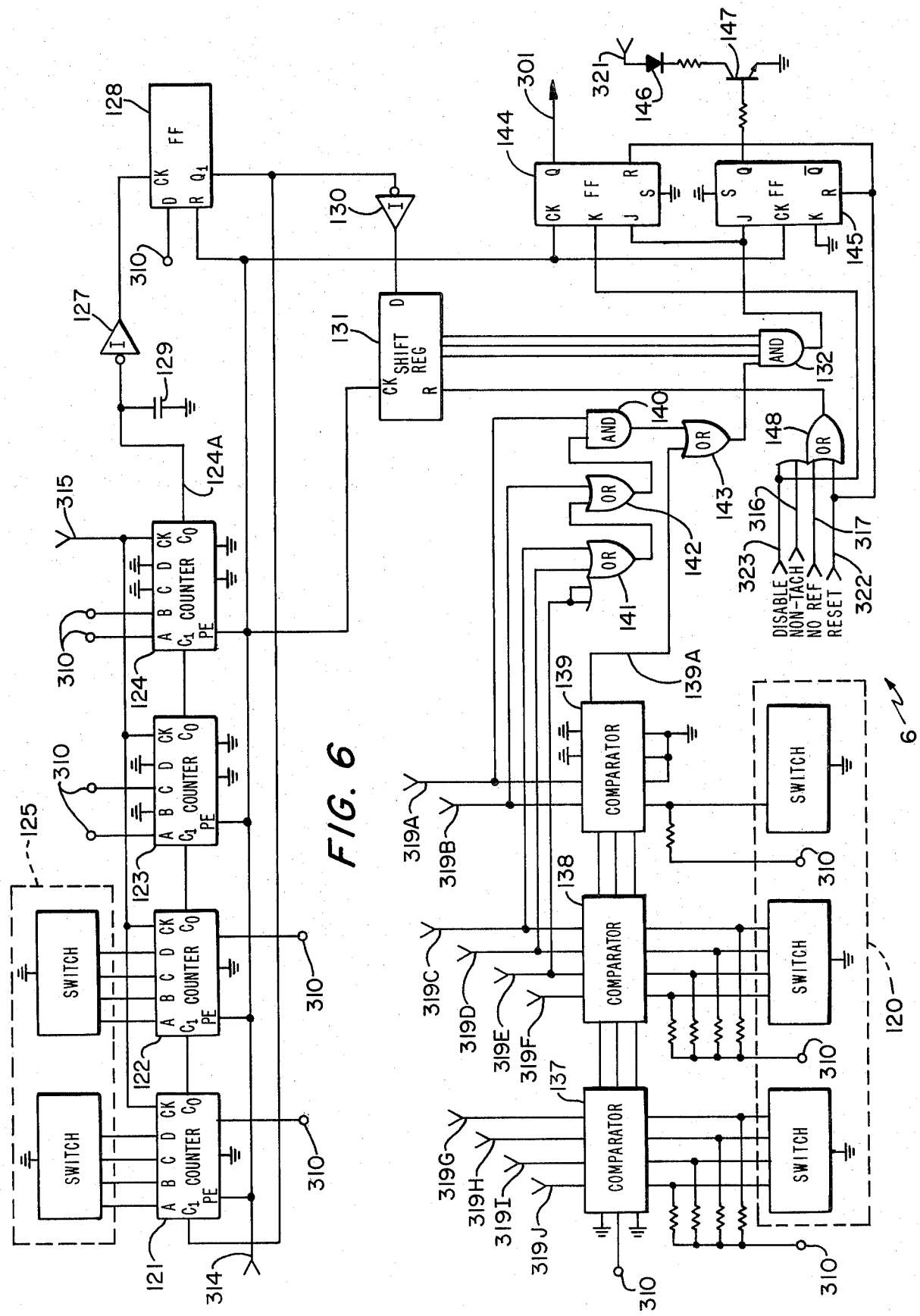
FIG. 6 shows schematically the circuitry in the block labeled "Rate of Change of Angle Circuit" in FIG. 2.

In addition a rate of change of angle in conjunction with a maximum angle setting is provided by the circuit 6 through two additional thumbwheel switches 125 and 120 in FIG. 6. If the rate of change of the power angle exceeds the setting for three consecutive cycles and if the maximum setting or internal minimum angle setting is exceeded for one cycle, a second SCR 451 in FIG 12B in the contact circuit 18 conducts, providing, effectively, a pair of closed contacts and a further target lamp 146 in FIG. 6 is energized. Both the SCR 451 and the target lamp 146 remain "on" until they are reset. The slip rate setting is adjustable from zero to 99 RPM relative to 3600 RPM. This system allows the application engineer to alarm or trip the alternator 102 based on angle magnitude as well as slip rate.

The maximum power angle trip is set to just above the maximum expected steady-state power angle for the alternator when connected to the system. The operation of the relay may be used to annunciate and warn the operator that the maximum power angle is exceeded and that corrective action is required.

The slip rate trip enable angle is set to a value just greater than the calculated maximum transient power angle value. The maximum slip rate trip is set to a value which allows the alternator 102 to slip poles at a rate which does not damage the alternator from negative sequence heating. The slip rate trip enable angle setting prevents the relay 106 from operating during alternator swings within transient stability limits. For a transient in which the alternator slips a pole, the maximum power angle alarm will warn the operator of an unusual condition, but the alternator is not automatically tripped unless the maximum slip rate is exceeded. This allows the alternator to slip a pole and possibly resynchronize for a system transient for which the alternator is not stable. During the swing, the alternator operates as an induction generator. If the slip rate is at a value which causes excessive rotor heating, the maximum slip rate trip setting will operate and trip the alternator 102.

Figure 8:
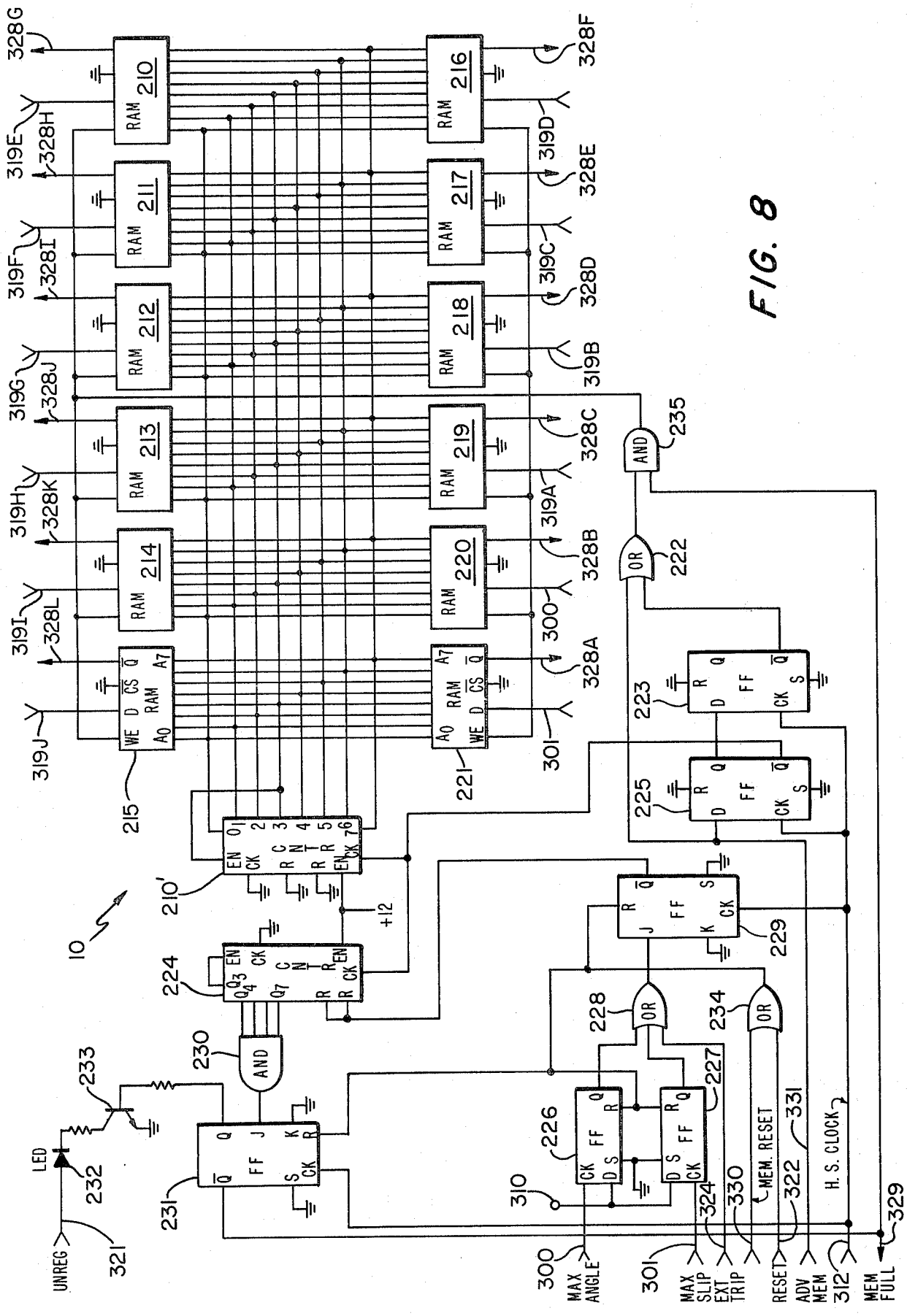
FIG. 8 shows schematically the circuitry labeled "Memory" in FIG. 2.

The internal memory 10 in FIGS. 2 and 8 allows the history of the power angle to be stored, allowing power angle values both before and after an operation to be available for analysis. the power angle is fed into a 256 word memory element in the memory 10 fifteen times a second on a continuous basis. When the power angle relay angle or slip rate settings are exceeded or when an external signal is applied to the "memory store" input 305, the memory 10, as later discussed, continues to store 240 up-dated values of the power angle before blocking further input. The result is a memory containing power angle values for a one-second period prior to the incident and for a sixteen-second period after the incident. In addition, information is stored which indicates the points at which both power angle relay SCR contacts 17 and 18 are operated. Upon receipt of a signal through the TTY-compatible serial interface 11 from the external computer 107 in FIG. 1, the memory 10 can be read to yield a power angle history relative to the incident that triggered memory storage. This system enables the computer 107 to sample the power angle relatively infrequently (i.e., once every ten seconds) during normal operation, while still acquiring power angle data at an effective high sampling rate after a major disturbance.

A thermal printer (not shown) may be employed to produce an image of the memory with an indication of the trip or alarm points; the printer can be used to allow memory read-out in lieu of an in-plant computer.

The shaft position detector 105, as later discussed, is an optical or other device which generates a pulse for each revolution of the shaft based on the location of a reflecting band or the like on the shaft surface. The detector uses two LED-photo transistors to filter out spurious reflection due to the presence of contaminants on the reflecting band.

The power angle relay 106 measures and utilizes the phase angle between the mechanical alternator shaft 102A and a reference voltage proportional to the instantaneous voltage at some bus in the system 101. In performing system studies for planning purposes, the reference voltage for a generating units' power angle is often that of a swing bus or fictitious infinite bus. In practical terms these voltages are not well defined or available. In addition, the power angle between a generating unit (i.e., the synchronous alternator 102 in FIG. 1) and some distant "infinite bus" is not a measure of the unit's dynamics with respect to the system to which the alternator is connected. If the reference voltage is chosen such that the effective impedance from the reference bus back into the generating unit during a swing is larger than the impedance from the reference bus to the effective system center, the resulting power angle is an adequate indication of the generating unit's dynamics relative to the system. The voltage at the high side of the unit transformer 103 in FIG. 1 is usually an adequate reference for observing the generating unit's dynamics with respect to the system.

The tach signal from the shaft position detector 105 in FIG. 1 produces a pulse greater than 50 $\mu S$ wide and nominally five volts in amplitude for each rotation of the shaft. The detector consists of a pair of light emitting diodes and phototransistors to detect a high contrast reflecting band on the generator. The shaft position detector 105 in actual apparatus is equipped with facilities to connect an air supply and thus maintain a positive pressure at the surface of the phototransistors to inhibit the collection of dirt and oils. The condition of these sensors and the shaft should be regularly monitored and maintained to assure a proper tachometer signal.

The loss of either the reference voltage or the tach signal, as later discussed, will cause a corresponding light emitting diode (the diodes 184 and 185, respectively in FIG. 7) on the front of the power angle relay 106 to light. Also the loss of either signal will block operation of the two trip circuits 17 and 18 in the relay 106. However, the loss of the reference signal for more than twenty cycles and its subsequent re-application may yield a trip condition.

Figure 4:
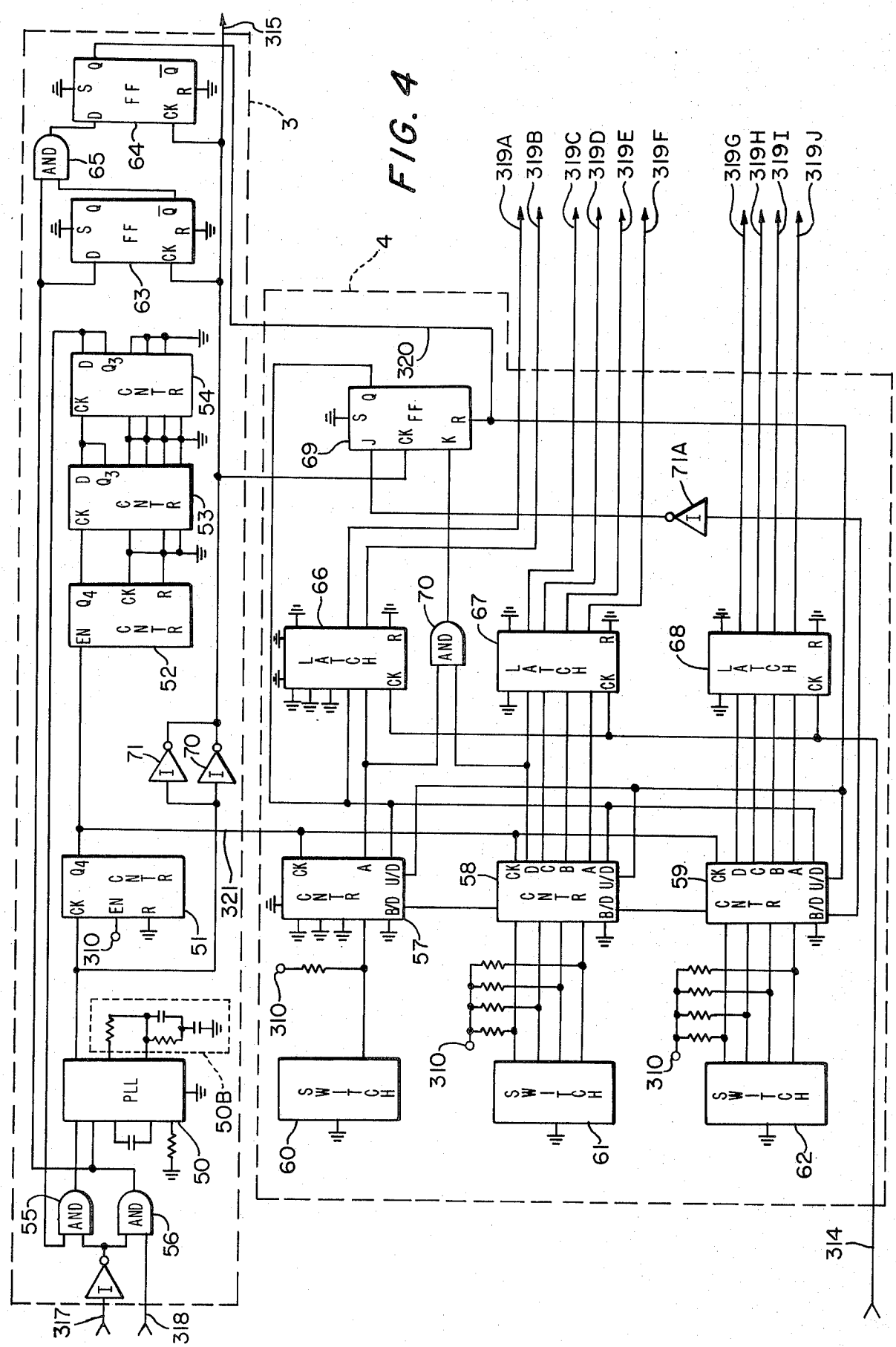
FIG. 4 shows schematically circuitry in the blocks labeled "Phase Locked Loop Circuit" and "Phase Angle Measuring Circuit" in FIG. 2.

The power angle monitor 106 contains the LED digital display 8 which displays the existing power angle and is up-dated every cycle of the rotor shaft. The analog output at 309 is derived through the D/A converter 9 from the digital representation of the power angle. Offset thumbwheel switches 60, 61 and 62 in FIG. 4 are used as a unit to adjust the power angle offset. After the alternator 102 is paralleled, and before load is increased, this thumbwheel should be adjusted to yield a zero reading of the power angle corresponding to the angle between the direct axis and the reference voltage.

The two trip circuits 17 and 18 in FIGS. 2, 12A and 12B, as above indicated, utilize the thumbwheel switches 80 in FIG. 5 and 125 and 120 in FIG. 6 and employ a seal-in feature and traget lights.

One trip circuit, the circuit 17, is based on a maximum power angle corresponding to the reading of the angle in degrees on the thumbwheel switch 80 on the front of the relay 106. In addition, as above indicated, a hard-wired minimum angle setting is included in the relay 106. It is nominally set to −20°. Should the power angle increase beyond the maximum angle setting or decrease below the minimum angle setting for four consecutive rotations of the rotor shaft, a gate signal is applied to the maximum angle SCR 450 in the trip circuit 17, energizing the SCR gate seal-in circuit, turning on the target light labeled 92 in FIG. 5, and the initiating memory storage at 10.

A second trip circuit, the trip circuit 18, based on a maximum slip rate corresponding to the setting of the thumbwheel switch 125 (FIG. 6) in RPM beyond the equivalent RPM of the reference voltage is measured by the rate of change of angle circuit 6. In addition, a maximum slip rate trip enable angle is set in degrees on the thumbwheel switch 120 on the front of the relay. Should the power angle slip rate exceed the maximum slip rate setting for three consecutive cycles of the rotor shaft and should the power angle exceed the maximum slip rate trip enable angle or be below the hardwire set minimum angle, a gate signal is applied to the maximum slip rate SCR 451, in the trip circuit 18, energizing the SCR gate seal-in circuit, turning on the target light labeled 146 in FIG. 6, and initiating memory storage. This prevents the relay from operating for high slip conditions while the alternator 102 is returning to a new stable state, a situation that often results after a fault has occurred and has been cleared. The generator power angle is within expected bounds and is slipping relative to the system toward a steady-state power angle. By setting the maximum slip rate trip enable angle to slightly higher than anticipated values for a stable swing after a transient, the relay 106 will be blocked from operating while still allowing protection against high slip rates outside of the stable operating region.

A dc input, i.e., the input labeled 304 in FIG. 2 and 304A and 304B in FIG. 11, is provided at terminals at the back of the relay 106 to inhibit relay operation during paralleling of the generator, etc.; the dc imput at 304 also resets the two trip circuit SCR gates in the circuits 17 and 18 but does not reset the targets 92 and 146 in FIGS. 5 and 6, respectively.

The power angle relay 106, as above indicated, contains a 256 word memory element in the memory 10 which continuously stores the value of the power angle and the status of the gate signals on the two trip SCRs 450 and 451 (FIGS. 12A and 12B) in the circuits 17 and 18 every 1/15 of a second. When the power angle relay angle or slip rate settings are exceed or when an external dc signal (e.g., 250 volts) is applied to the "memory store" input 305 on the back of the relay 106, the memory 10 will read and store 250 up-dated values of the power angle and SCR gate status data, sampled every 1/15 of a second, before blocking further input. The result is a memory containing power angle values for one second prior to and for a sixteen second period after the occurrence of either trip point being exceeded or the application of the "memory store" input signal. Thus after the power angle relay angle or slip rate settings are exceeded or after the external "memory store" input 305 is applied and after the 240 up-dated values are stored, a memory full LED 232 in FIG. 8 on the front panel is lit, and the memory 10 is inhibited from further storage.

The memory 10 can be interrogated upon receipt of the proper signal on conductor 303 in FIGS. 1 and 2 through the interface 11 from the computer 107. If the relay 106 is connected to a teletype it will respond to two inputs; see said writing for further details.

Before commencing a detailed discussion of the schematics of FIGS. 3–12, some preliminary comments on the approach used below are in order. The system described hereinafter is an actual system built and tested. While circuit values are not needed to understand the system operation, some such values are included to place the explanation in context. In the figures, conventional representations are used to show circuit elements. Thus, capacitors, resistors, diodes, and so forth, in most instances need not either be further labeled or discussed. In the figures, block representations and logic elements are named, but in the text only those needed to ensure understanding of the system are discussed. For example, a detailed explanation of the clock 12 (which is 2.4576 MHz in the actual apparatus) in FIG. 10 is not needed since the schematic is self-explanatory; also, the power supply shown at 13 in FIG. 2 is not shown schematically at all, it being noted that in the actual apparatus the input at 306 is 120 volts ac, the unregulated output 321 is +10 volts dc, the regulated output 310 is +12 volts dc, and these outputs 321 and 310 are marked in later figures, mostly without further comment. At conductor 315 in FIG. 2 a clock signal output of 3600 times the reference voltage frequency is provided in actual apparatus from the phase-locked loop circuit 3, as later discussed; the clock 12 outputs at 312 is 307 kHz and at 311 is the baud rate clock and is variable, and so forth. Also, reference may be had to said writing for further information.

Figure 3:
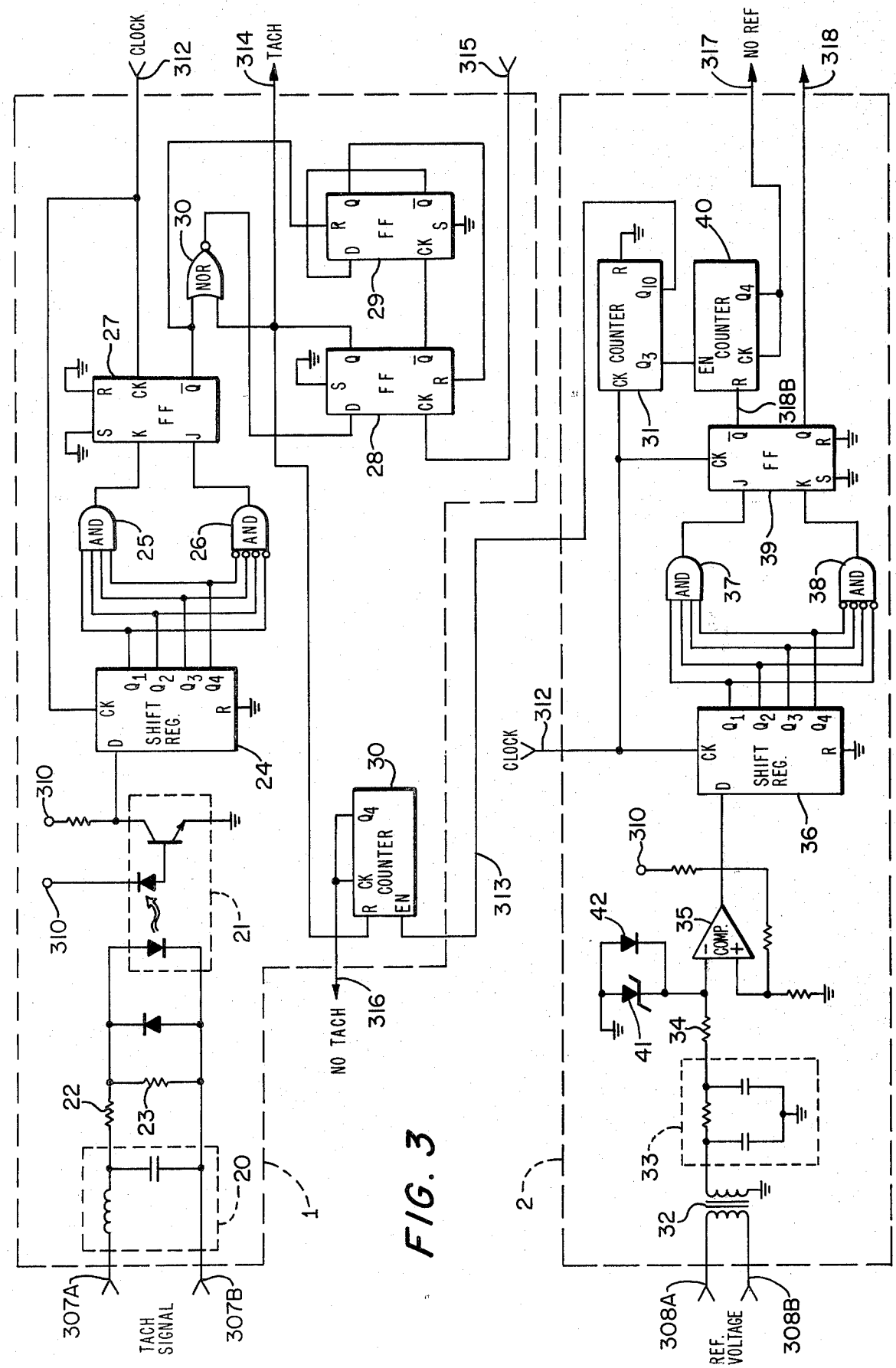
FIG. 3 shows schematically the circuitry in the blocks labeled "Signal Conditioning Circuit #1" and "Signal Conditioning Circuit #2" in FIG. 2.

Two independent signals are processed by the circuitry of FIG. 3: one is the electric signal on conductors 307A and 307B from the detector 105 and the other is the reference voltage waveform on conductors 308A and 308B from the potential transformer 104. The shaft position detector signal on the conductors 307A and 307B is fed to an opto-isolator 21 after passing through an LC filter 20 to remove any noise. A resistor 22 in series with the isolator helps prevent excessive current and a resistor 23 across it prevents leakage or small currents from causing an output signal. Because accurate position information from the shaft position detector is required, a high speed opto-isolator is used at 21. By using optical isolation, the ground of the shaft position detector 105 can be isolated from the power angle relay ground. The problems associated with ground loops and long cable runs can thus be eliminated. The output of the isolator 21 is applied to the D input of a shift register 24 which is clocked by the 307 kHz clock in actual apparatus. The four outputs of the shift register 24 are ANDed together by two AND gates 25 and 26, the AND gate 25 looking for all outputs simultaneously high and the AND gate 26 looking for all outputs simultaneously low. These two AND gates are connected to the J and K inputs of a JK flip-flop 27. If the input signal to the shift register 24 is high for four consecutive samples the flip flop 27 output will go high. If the shift register input is low for four consecutive samples the flip flop 27 output will go low. Any other conditions result in no change at the output of the flip flop 27. This technique is very effective in removing stray noise spikes. Two D flip flops 28 and 29 and a NOR gate 30 are connected to the output of the JK flip flop 27 and clocked by the 3600X clock (i.e., 216 kHz in 60 Hz systems) along conductor 315 from the phase locked loop circuit 3 in FIG. 4. They create an output tach signal on conductor 314 which is a pulse one 3600X clock pulse wide, synchronized to the 3600X clock output 315 of the circuit 3 and initiated by the shaft position detector signal. The tach signal on the conductor 314 is used by many other elements in the system and because it is synchronized to the 3600X clock it allows for synchronous operation of the relay logic.

The tach signal is connected within the circuit 1 to the reset of a counter 30 which is clocked by the output of a counter 31 in the circuit 2 that provides a clock signal at a 300 Hz rate, derived from the 307 kHz clock 12. Under normal operation the counter 30 is always counting but is also reset by the tach signal before the Q4 output thereof becomes high. If the tach signal is lost, the counter is not reset, and will count until Q4 is high. This creates a "no tach signal" (also called "no-shaft position signal" herein) on conductor 316 and inhibits further counting of the counter 30. The no tach signal is displayed by the LED 185 of FIG. 7 and used to prevent false tripping by the relay 106.

The reference voltage waveform is introduced at 308A and 308B in FIG. 3 and is reduced by a transformer 32. The relay voltage is then filtered by a capacitor and an RC filter in the block marked 33. A resistor 34 connects the output of the filter 33 to the negative input of a comparator 35. A germanium diode 42 and zener diode 41 prevent the input from exceeding the operational limits of the comparator 35. Hysteresis is used around the comparator 35 to provide clean output transitions. Additionally, the hysteresis is arranged so that if the reference voltage between conductors 308A and 308B is below some predetermined level on the input, no output signal will result. The output of the comparator 35 is connected to the D input of a shift register 36, which is clocked by the 307 kHz clock 12. The four outputs of the shift register 36 are ANDed together by two AND gates 37 and 38; the AND gate 37 looks for all outputs that are simultaneously high and the AND gate 38 looks for all outputs to be simultaneously low. The two AND gates 37 and 38 are connected to the J and K inputs of a JK flip flop 39. If the input signal to the shift register 36 is high for four consecutive samples, the flip flop 39 output will go high. If the shift register 36 input is low for four consecutive samples, the flip flop 39 output will go low. Any other conditions result in no change of the output. This technique is very effective in removing stray noise spikes. The output of the flip flop 39 is passed along the conductor 318 to the circuitry of FIG. 4 as the actual reference voltage that is used there.

The reference voltage is also connected by a conductor 318B in FIG. 3 to the reset of a counter 40 which is clocked by the output of the counter 31 that provides a clock signal at a 600 Hz rate, derived from the 307 kHz clock 312.

Under normal operation counter 40 is always counting but is reset by the reference voltage before the Q4 output thereof becomes high. If the reference voltage is lost, the counter 40 is not reset, and will count until Q4 is high. This creates a no reference signal on conductor 317 and inhibits further counting of the counter 40. The no reference signal is displayed by LED 184 in FIG. 7, used by the circuitry of FIG. 4 to set the phase locked loop labeled 50 in FIG. 4 to open loop, and used to prevent false tripping by the relay 106.

The circuitry of FIG. 3, as above indicated, interacts with the circuitry of FIG. 4 which shows in schematic form, the phase locked loop circuit 3 and the phase angle measuring circuit 4.

The heart of the power angle relay 106 is the phase locked loop 50 in the phase loop circuit 3 of FIG. 4. The phase locked loop 50 is connected with counters 51, 52, 53 and 54 to form a frequency multiplier. The phase locked loop 50 is arranged to lock on to the reference voltage signal and generate two clock signals, one 360 times (the 360X clock herein on conductor 321) and one 3600 times (the 3600X clock herein on conductor 315) the reference voltage frequency. Each clock pulse of the first clock corresponds to one degree of phase shift of the reference voltage. Since the phase locked loop tracks any changes in reference frequency, each clock pulse is always equal to one degree of phase shift, regardless of reference voltage frequency changes. The voltage controlled oscillator output of the phase locked loop 50 is connected to clock the two divide by ten counters 51 and 52 and two divide by six counters 53 and 54. The reference voltage signal 318 and the output of the counter 54 are connected as inputs to the phase detector in the phase locked loop 50. The closed loop action of the phase locked loop 50 makes the output frequency of the counter 54 equal to the reference frequency. This implies that the voltage controlled oscillator output of the phase locked loop 50 must be running at $10 \times 10 \times 6 \times 6$ or 3600 times the reference voltage frequency. The output after the first divide by ten counter 51 will be 360 times the reference frequency. The 3600X clock is buffered by two inverters 70 and 71 and used as a synchronous clock on the conductor 315 by circuits in FIG. 4 and elsewhere. The loop filter labeled 50B of the phase locked loop 50 is set at ten seconds so that it will only track slow changes in the system frequency and filter fast changes such as during a high speed reclosing breaker operation. Lead-lag compensation is used in the loop filter for improved loop dynamics. The inputs to the phase lock loop 50 pass through two AND gates 55 and 56. When the NO REF signal on the conductor 317 goes high, indicating loss of reference, the inputs to the phase lock loop are disconnected. The voltage controlled oscillator therein will run open loop at the last frequency before the reference was lost. A large capacitor in the loop filter (1μF in actual apparatus), which supplies current to the voltage controlled oscillator of the phase locked loop 50, is included so that the open loop frequency of the voltage controlled oscillator will be maintained as long as possible. Phase error is the integral of frequency error; so it is important that frequency error be minimized.

The 360X clock on the conductor 321 is used to advance three BCD counters 57, 58, and 59 in the phase angle measuring circuit 4 of FIG. 4. The counters 57–59 act as a unit and are advanced by the 360X pulses on the conductor 321 from the circuit 3 so that there is one clock pulse for every degree, that is, the counters 57–59 can be read in degrees. Since the counters 57–59 are clocked by the clock signal (i.e., the 360X pulses) from the phase locked loop, the contents of the counters 57–59 always reflect the time angle between the shaft position signal and the reference voltage irrespective of the frequency of the reference voltage waveform. The counters 57–59 are preset to a value selected from thumbwheel switches 60–62, respectively, by a signal on conductor 320 developed from the leading edge of the reference voltage signal. The reference voltage signal is generally a square wave derived from the reference voltage waveform. A pulse is needed to reset the counters; so a pulse, synchronized to the 3600X clock at the leading edge of the reference, is developed by two flip flops 63 and 64, and AND gate 65 in the phase locked loop circuit 3. The output of the three BCD counters 57–59 are connected as input to three quad latches 66–68, respectively. The contents of the counters 57–59 are sampled when a tach pulse activates the clock line on the latches. The contents of the counters 57–59 represent the phase shift in degrees between the counter preset pulse generated from the reference voltage signal and the tach pulse generated from the shaft position detector 105. Since the shaft detector signal does not necessarily correspond to the direct axis of the machine, and hence zero degrees, the counters 57–59 can be preset to a number other than zero by the thumbwheel switches 60–62. In practice the switches 60–62 are adjusted for a zero power angle reading when the generator 102 is putting out zero power but synchronized to the system 101. The setting on the switches 60–62 act as a constant phase shift to correct for the constant phase error of the shaft position signal.

The counters 57–59 are up/down counters controlled by a JK flip flop 69. They count from zero up to 180. The 180-state is detected by an AND gate 70 which causes the flip flop 69 to make the counters 57–59 count down. When the counters 57–59 reach zero, the carry out signal is inverted by an inverter 71A and causes the flip flop 69 to toggle again. Thus if the counters 57–59 are not preset, they will count up and down between zero and 180. This feature is used extensively when the reference signal is lost, giving a proper power angle reading, provided power system conditions do not change. The up/down control line is interpreted as a sign bit and is latched as such by the latch 66. The outputs of the latches 66–68 on conductor 319A–319J represent the power angle and are passed on to other parts of the relay 106 for display and processing.

The angle limit circuit 5, as shown in FIG. 5, receives inputs 319A–319J which contain information representing the magnitude of the power angle of the alternator 102; that magnitude is compared against settings on the thumbwheel switches 80 by three magnitude comparators 83–85. The sign bit is connected to the comparator 85 such that negative numbers will give no output therefrom regardless of the magnitude. However a positive angle larger than the setting of the switch 80 will create a high signal on lead 85A from the comparator 85. A combination of ANd and OR gates in 81, 86 and 87 create a signal if a negative angle whose magnitude is greater than nineteen degrees is detected. The signals from the comparator 85 and the AND gate 86 are ORed together by an OR gate 88 and fed to the D input of shift register 89. The shift register 89 is advanced by the tach pulse signal on the conductor 314 that causes the shift register 89 to sample the output of the OR gate 88 once every pulse or once every rotation of the shaft 102A. Since the shift register 89 is leading edge clocked, it samples the status of the data which was latched by the previous tach pulse on the phase angle measuring circuit 4 of FIG. 4. This scheme eliminates the effect of any racy behavior in the magnitude comparators. The four outputs of the shift register 89 are combined by an AND gate 82 and connected to the J input of two JK flip flops 90 and 91. If the power angle is greater than the set points as sampled by the shift register 89 on four successive samples, the two flip flops 90 and 91 are set. One flip flop, the flip flop 90 controls the MAX/MIN alarm target LED labeled 92 through a transistor 93. This flip-flop can only be reset by a reset signal from a manual reset switch 94. The other flip flop, the flip flop 91, controls the angle limit signal on conductor 300 to the max/min alarm contact circuit 17 and the memory 10. This flip flop can be reset by the reset switch 94 or through the K input thereto by a disable signal on conductor 323. The disable, no tach, no reference, and reset signals on conductors 323, 316, 317 and 322, respectively, are ORed together by an OR gate 95 and used to reset the shift register 89. If the reference or shaft position detector signal is lost, or a disable signal is applied, the shift register 89 is reset preventing further tripping of the relay 106. These signals will not however, reset the target 92 if the alarm has already tripped. This system provides for remote resetting of the contact circuit 17 if the alarm condition is alleviated but requires manual attention to reset the target light 92 to guard against possible loss of after-trip target information.

The target LED 92 requires a great deal of current relative to the remainder of the circuit 5. Therefore it is powered from a special unregulated power supply in the block 13 of FIG. 2, along the conductor 321. This supply is lost immediately upon power loss but the integrated circuit supply will remain for several tenths of a second since all heavy current users are powered by the unregulated supply on the conductor 321 and not by the regulated supply on the conductor 310.

The purpose of the rate of change of angle circuit 6 of FIG. 6 is to calculate the rate of change of the power angle. This is done by measuring the time between two successive tach pulses. Counters 121, 122, 123 and 124 are preset by the tach pulse on the conductor 314. The counter 122 and 123 are set to three and five respectively and are configured to count down. The counters 121 and 122 are set to the values on thumbwheel switch 125 and are connected to count up. All four counters are connected together and clocked by the 3600X clock developed in the circuit 3 of FIG. 4 (see conductor 315 in FIGS. 4 and 6). If the switch 125 is set to zero, it takes 3600 clock pulses for the counter to reach zero. If the switch is set to twenty, it takes 3580 clock pulses for the counter to reach zero. If the generator 102 is running at the same speed as the reference, the time between tach pulses is the same as the time between reference pulses or 3600 pulses from the 3600X clock on the conductor 315. If the generator is running faster than the reference (i.e., slipping poles), the time between tach pulses is less and therefore fewer of the 3600X clock pulses will be counted during this time. The carry out signal, line 124A from the counter 124, indicates if the counter has reached zero and this information is inverted by an inverter 127 and used to clock flip flop 128. A small (150 pF) capacitor 129 serves to eliminate any short spikes on the carry out output. The output of the flip flop 128 is inverted by an inverter 130 and applied to the D input of a shift register 131. The shift register 131 is clocked by the tach signal on the cnductor 314. If the composite counter made up of the counters 121-124, which is preset by the tach pulse, reaches zero before the next tach pulse, a zero is clocked into the D input of the shift register 131. If the composite counter does not reach zero before the next tach pulse, a one is shifted into the shift register 131. Thus, if the time between tach pulses is less and hence the slip rate is higher than that set on the switch 125, a one is shifted into the shift register in 131. The composite counter made up of the counters 121-125 has a resolution of one part in 3600 per sample or 0.1 degrees of rotation per sample. If the reference is running at 60 Hz, there will be 60 samples per second or 3600 samples per minute. Each sample can measure 0.1 degrees or 360 degrees a minute. Thus, the slip rate setting is nominally calibrated in revolutions per minute above synchronous speed or 3600 rpm. If the switch 125 is set to "20" and the generator 102 reaches a speed of 3620 rpm with a 60 Hz reference, a high signal will be shifted into the shift register in 131. The output of the shift register 131 is gated by an AND gate 132 with other signals before any action is taken to prevent tripping the alternator 102 when the slip rate is high but the alternator is slipping toward a new steady state angle.

The magnitude of the power angle from the circuit 4 in FIG. 4 is compared against settings on the thumbwheel switch 120 by three magnitude comparators 137, 138 and 139 in FIG. 6. The sign bit is connected to the comparator 139 such that negative numbers will give no output signal therefrom, regardless of the magnitude. However, a positive angle larger than the switch 120 setting will create a high signal on 139A of the comparator 139. A combination of AND gates 140 and OR gates 141 and 142 create a high signal if a negative angle whose magnitude is greater than nineteen degrees is detected. The signals from the comparator 139 (i.e., the signal on the pin 139A) and AND gate 140 are ORed together by an OR gate 143. The output of the OR gate 143 and three outputs of the shift register 131 are ANDed by the AND gate 132. THe output of the AND gate 132 is connected to the J input of two JK flip flops in 144 and 145. If the slip rate is greater than the set point on three consecutive samples and the absolute angle is more positive than the positive setting or more negative than −19 degrees, the two JK flip flops 144 and 145 will be set. One flip flop, the flip flop 145, controls a RATE alarm target LED 146 through a transistor 147. The flip flop 145 can be reset by a reset signal on the conductor 322 from the reset switch 94 in FIG. 5. The flip flop 144 (whose output on conductor 301 is the rate of angle limit signal herein) can be reset by a reset signal on the conductor 322 from the reset switch 94 or through the K input thereof by the disable signal on the conductor 323. The disable, no-tach, no-reference, or reset signals are ORed together by an OR gate 148 and used to reset the shift register 131. If the reference of shaft position detector signal is lost, or a disable signal is applied, the shift register 131 is reset preventing further tripping of the relay 106. These signals will not, however, reset the target if the alarm has already tripped. This system provides for remote resetting of the contacts if the alarm condition is alleviated but requires manual attention to reset the target to guard against possible loss of after-trip target information.

The target LED 146 uses a great deal of current relative to the remainder of the circuit. Therefore, it is powered by the input 321 from a special unregulated power supply in the block 13 of FIG. 2, as above noted. This supply 13 is lost immediately upon power loss but the integrated circuit supply on the conductor 310 will remain for several tenths of a second since all heavy current requirements are powered by the unregulated supply on the conductor 321.

Figure 7:
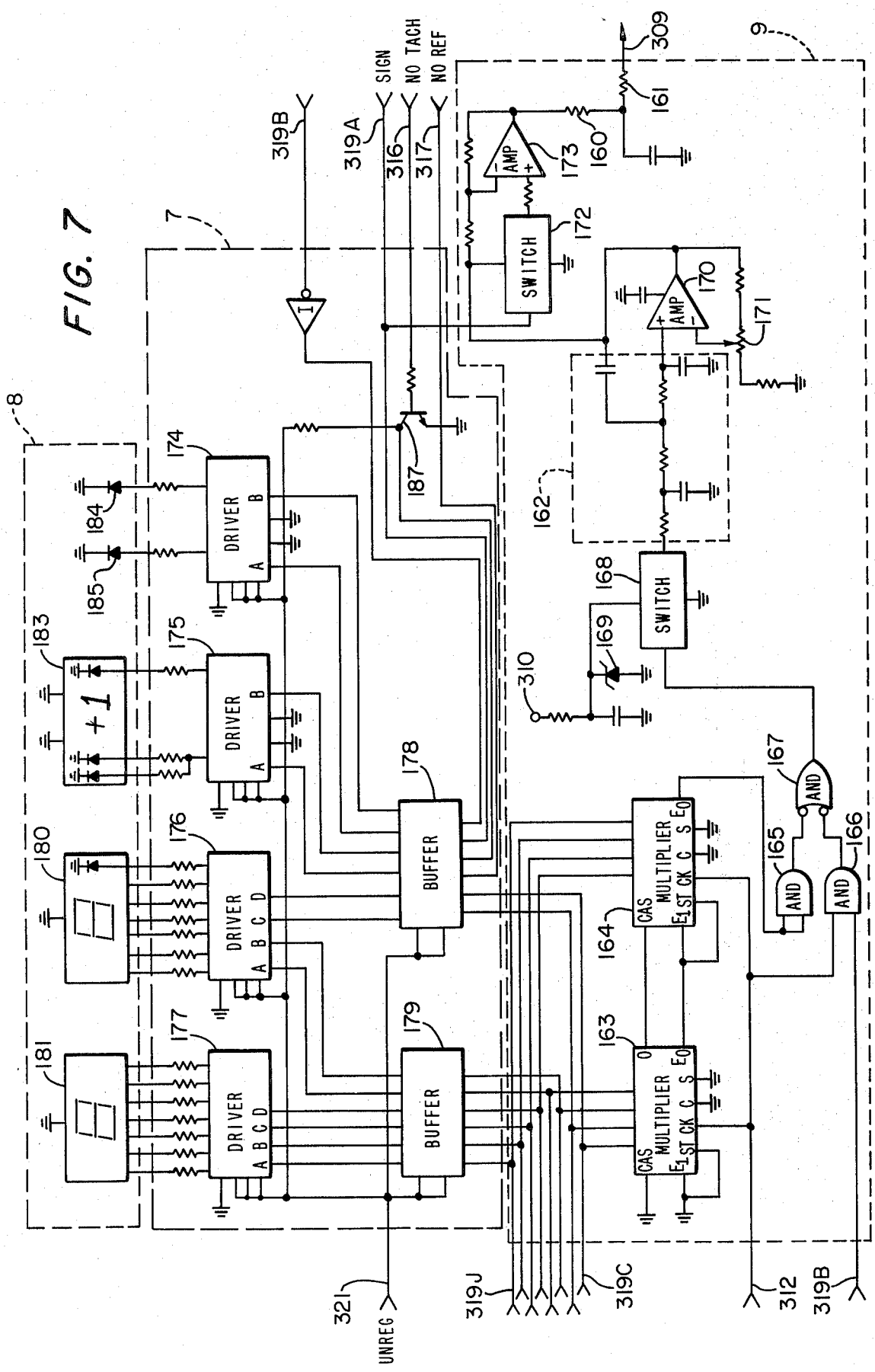
FIG. 7 shows schematically the circuits in the block labeled "Display Angle Circuit," "Digital Readout" and "D/A Converter" in FIG. 2.

The circuitry of FIG. 7 provides for visual indication of the power angle on the digital readout 8 as well as an analog output on conductor 309. The analog output is provided by the D/A converter 9. The D/A converter employed generates a constant frequency, variable pulse width waveform and then filters the waveform with a low pass filter comprising components 162 and an amplifier 170. Elements 163 and 164 in the converter 9 are rate multipliers which multiply a constant input frequency on conductor 312 by a digital number on conductors 319C-319J and give an output frequency which is the product. The input frequency is the 307 kHz clock. The digital input is the lower two digits of the power angle. The internal operation of the rate multipliers 163 and 164 is such that the output waveform is ANDed with the clock signal on the conductor 312. When the clock is low the output is low. The hundreds digit is combined with this waveform by the AND gates 165-167 so that when the hundreds digit is high the portion of the waveform from the multiplier 164 that was low when the clock was low is now made high. The composite waveform is used to drive a single pole double throw switch 168. Depending on the control signal the output is either connected to ground or a reference potential. The reference potential is developed with a 1N825 temperature compensated zener diode 169. The output of the switch 168 is filtered with an active three-pole butterworth filter using an amplifier 170. The gain of the amplifier 170 can be adjusted by a trim pot 171 so that the desired scale factor can be achieved. The sign bit on conductor 319A is used to control another single pole double throw switch 172. The output of the switch 172 is connected to the plus input of an amplifier 173. If the sign of the angle is positive, the plus terminal of the amplifier 173 is connected to the output of the amplifier 170. This gives the amplifier 173 a gain of plus one. If the sign of the angle is negative the plus terminal of the amplifier is connected to ground making the amplifier 173, at this juncture, an inverting amplifier with a gain of one tenth. The voltage output of the amplifier 173 is then converted to a current signal by the resistors 160 and 161 to create an output current signal which is easy to protect against noise.

The power angle signals in the display angle circuit 7 of FIG. 7 are buffered by buffers 178 and 179. The buffers 178 and 179 are designed for input signals higher in voltage than the power supply input at 321. The outputs of these buffers are connected to four seven segment display drivers 174-177. The drivers 176 and 177 are used to drive two seven segment displays 180 and 181, respectively, and the drivers 174 and 175 are used to drive a minus sign and hundreds digit 183, no reference LED 184 and no tach LED 185. The specially selected buffers 178 and 179 allow the buffers, digit drivers, and LED's to all be powered from the unregulated supply on the conductor 321. This supply is lost immediately upon power loss but the integrated circuit supply on the conductor 310 will remain for several tenths of a second since all heavy current requirements are supplied by the unregulated supply. The single transistor inverter labeled 187 is used in place of an integrated circuit inverter because of space limitations.

The memory 10 in FIG. 8 contains 3072 bits of information organized as 256 words of twelve bits each on RAM 210–221. Ten bits are used to store the power angle including sign and two bits are used to store the condition of the contact circuits 17 and 18, closed or open. The memory chips 210–221 are 256×1 bit CMOS static RAMS and are selected for their low power and ability to run on 12-volt supplies. The address lines are connected to an eight-bit counter 210'. The RAMS 210–221 are normally write enabled so that the current power angle is written into the chip and available at the output. A high-to-low transition on the memory advance line disables the write enable signal through an OR gate 222. A D flip flop 225 picks up this signal one clock pulse later and applies a clock signal to counters 224 and 210'. A second clock pulse later a second D flip flop 223 takes the signal from the first flip flop 225 and through the OR gate 222 reapplies the write enable signal to the RAMS 210–221. The net result is that when the address to the memory is changed, the write enable signal is removed one clock pulse before the address change and reapplied one clock pulse after. This ensures that no wrong data are stored in the memory 10 as it changes from one address to another.

The maximum-minimum and rate alarm signals respectively on conductors 300 and 301 are used to clock two D flip flops in 226 and 227. An OR gate 228 combines the outputs of these flip flops and the memory trip signal on conductor 324 into one and sets a JK flip flop 229 through the J input if any of these signals becomes high. When the flip flop 229 is set, it removes the reset signals from the counter 224 and allows the counter 224 to advance with the advance memory clock as does the counter 210. The four most significant bits of the counter 224 are ANDed together by an AND gate 230 whose output is connected to the J input of a JK flip flop 231. When the counter 224 has advanced 240 counts, the AND gate 230 will detect this condition and set the flip flop 231. The flip flop 231 will inhibit further write enable signals through an AND gate 235 and provide a memory full signal on conductor 329 to the computer interface 11 in FIGS. 2 and 9. A memory full LED 232 is also activated through a transistor 233.

Under normal circumstances the memories 210–221 are write enabled and continually storing data. A fifteen Hz memory advance clock on conductor 331 advances the memory addresses and ensures that the memory is continually filling with current power angle data. If a memory trip signal or maximum-minimum or rate alarm signal is received, the flip flop 229 is set, enabling the counter 224. When the counter 224 gets to a 240 count, the flip flop 231 is set, prohibiting further storing of data. At this point, the memory 10 contains 240 data points after the alarm or trip point and 16 data points which were stored prior to the trip and did not have data rewritten over them. These data points can then be read out under control of the advance memory signal on the conductor 331. The memory reset signal on conductor 330 and master reset 322 or ORed by an OR gate 234 which resets both the JK flip flops 229 and 231, allowing the memory to once again store new data. They additionally reset the two D flip flops 226 and 227 connected to the maximum-minimum and rate alarms. The flip flops 226 and 227 are arranged to be set when the alarm is first encountered. If the memory 10 is subsequently filled, interrogated, and reset, the flip flops 226 and 227 will not be set again until the alarm condition is removed and reapplied. Thus, the memory 10 will not continue to be filled, interrogated, and reset for a single alarm condition, but rather only once when the alarm condition is first encountered.

The memory full LED 232 requires a great deal of current relative to the remainder of the circuit. Therefore it is powered by the input 321 thereto from a special unregulated power supply in the block 13 of FIG. 2. This supply is lost immediately upon power loss, but the integrated circuit supply on the conductor 310 will remain for several tenths of a second since all heavy current requirements are supplied by the unregulated supply.

Figure 9:
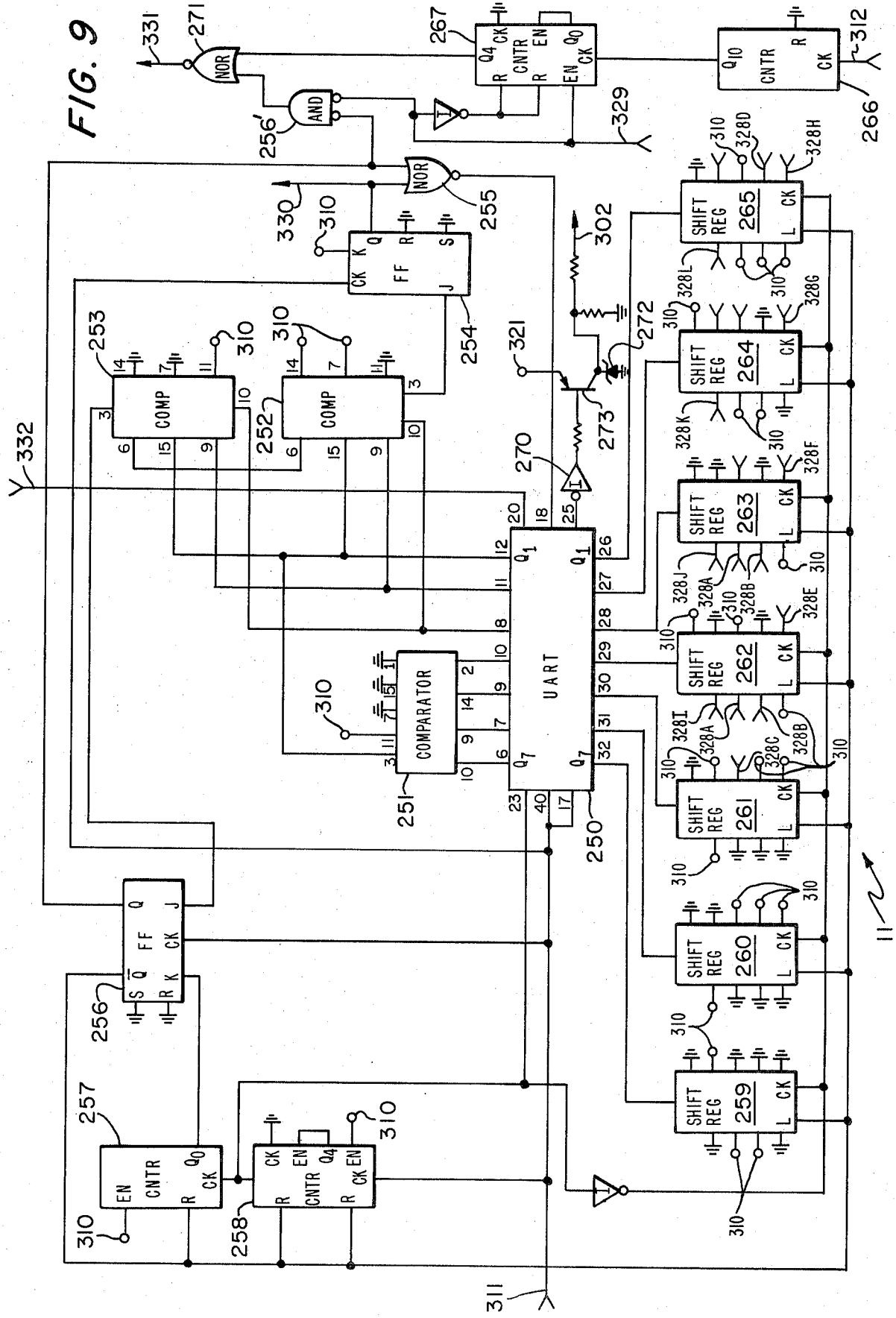
FIG. 9 shows schematically the circuitry labeled "Computer Interface Circuit" in FIG. 2.

The computer interface 11 in FIG. 9 is built around an LSI circuit 250 called a Universal Asynchronous Receiver Transmitter or UART. The chip 250 takes seven parallel inputs, usually an ASCII character, and transmits them serially with start and stop bits in a universally defined pattern for asynchronous data transmission. The chip 250 also has the capability of simultaneously receiving serial data, stripping off the start and stop bits and reassembling seven bit parallel characters. Comparators 251–253 are magnitude comparators connected to the parallel output of the UART 250. They are arranged to detect two ASCII characters "R" and "A" from a teletype or the like, not shown in the figures. If an R is detected, a signal from the comparator 252 sets a JK flip flop 254. The Q output of the flip flop 254 sends a signal through a NOR gate 255 to acknowledge the character to the UART 250. It also sends a memory reset signal to the memory 10 on the conductor 330 telling it to start up-dating the memory once again with power angle data. The flip flop 254 is reset on the next clock pulse on the conductor 311 from the baud rate clock, and the UART 250 is ready to accept another character.

If the ASCII character A is detected, a signal from the comparator 253 sets a JK flip flop 256. The Q output of the flip flop 256 sends an acknowledge signal to the UART 250 through the NOR gate 255. It also sends a memory advance signal to the memory 10 through an AND gate 256' and NOR gate 271 if the memory is full and the data are being read from the memory instead of the present power angle. The $\overline{Q}$ output of the flip flops 256 removes the reset signal from counters 257 and 258 as well as allows the information parallel loaded into the shift registers 259–265 to be serially clocked out. The UART 250 operates from a clock supplied by the baud rate clock on the conductor 311 from the clock 12 in FIG. 10. The UART 250 uses sixteen baud rate clock pulses to transmit one bit and eleven bits to transmit one character. The baud rate clock is therefore divided by two hundred and fifty-six by the counter 258. This output is used to strobe data into the UART 250 for transmission and advance data in the parallel load shift registers 259–265. The counter 257 is a character counter and resets the flip flop 256 through its K input after nine characters have been transmitted. The characters transmitted come from the shift registers 259-265. The characters are parallel loaded into the shift registers 259-265 from the memory outputs along with a carriage return and line feed character. See Table 1 below. Selected bits are loaded into the shift register to convert the BCD digits into ASCII characters and the contact status bits into the characters "O" and "C" for open and closed. If the memory 10 is full at the time of transmission, the message is preceded by an "S" for stored angle. If the memory 10 is not full a "P" for present angle is transmitted. The BCD digits and sign are transmitted one at a time as ASCII characters by advancing them through the shift registers 259-265 until they are loaded into the UART 250.

If the memory 10 is full, the advance memory signal comes each time twelve bits of information are read and transmitted by the UART 250. To interrogate the entire memory 10 it is simply necessary to send the character "A", 256 times with sufficient time in between for the relay 106 to answer back with nine characters of power angle data and status. If the memory 10 is not full or has been reset, the advance memory signal comes from a fifteen Hz clock generated from the 307 kHz clock by counters 266 and 267. The output of the UART 250 is inverted by an inverter 270 which is used to drive a transistor 273. A zener diode 272 serves to protect the transistor 273 from transients on the computer interface line 302. Table 1, above discussed, now follows.

spectively. A diode 415 protects the opto-isolator 412 against reverse voltage.

The output of the opto-isolator 412 in FIG. 11 is connected to the reset input of a counter 416. With no input signal applied, the reset of the counter 416 is high and the Q4 output thereof is low. If an input signal is applied, the reset input goes low and the counter 416 begins to count. The counter 416 counts high speed clock pulses at a rate of approximately 307 KHz. If the reset signal remains low for eight clock pulses or 26 $\mu$sec., the Q4 output thereof will go high providing an output signal on the conductor 323. The signal on the conductor 312 is also connected to the enable input of the counter 416 to inhibit further counting by the counter 416. Therefore the Q4 output will remain high while the reset if low. This system is designed to eliminate any noise pulses which make it through the RC filter on the input of the opto-isolator 412. Any signals whose duration is shorter than 26 $\mu$S will not get through.

The serial input to the circuit 16 from the computer 107 on the conductors 303A-303B is a 20 mA current signal and is fed into the opto-isolator 414 after passing through an LC filter to remove any noise. A resistor in series with the opto-isolator 414 helps prevent excessive current and a resistor across it prevents leakage or small currents from causing an output signal. Because high speed data must pass through the opto-isolator 414, a high speed version is used. By using optical isolation,

TABLE 1

| CR | LF | 0 OR 0 | 0 OR O | UNITS | TENS | HUNDREDS | SIGN | P OR S |
|---|---|---|---|---|---|---|---|---|
| Last character sent | | rate max-min | | | | | | First character sent |

The circuits in FIG. 11 are the signal conditioning circuits 14, 15 and 16 of FIG. 2 whose inputs are clock signals on the conductor 312 and further signals on conductors 304, 305 and 303, the latter, as shown in FIG. 11, being two-conductor inputs 304A-304B, 305A-305B and 303A-303B, respectively. The conditioning circuits 14 and 15 are identical to one another and the conditioning circuit 16 is like the other two. The circuit 14 conditions disable signals on the conductors 304A-304B; the circuit 15 conditions memory trip signals on the conductors 305A-305B; and circuit 16 conditions serial inputs on conductors 303A-303B from the computer 107 in FIG. 1. The three conditioning circuits each contain opto-isolators which are labeled 412, 413 and 414. These circuits are now discussed in some detail in the next few paragraphs.

The input conditioning circuitry of FIG. 11, as above indicated, contains the circuitry to interface disable and memory trip signals from a power plant and current loop signals from the computer interface 11 with the logic signals of the relay 106. The circuits 14 and 15 for the disable and memory trip signals, respectively, are identical; so the circuit 15 is not described. The external signal on the conductors 304A-304B is converted to a current by a resistor 410 in the circuit 14. This current is then applied to the input of the optical isolator 412. Optical isolators are used so that complete ground isolation can be maintained and the input circuit will be as flexible to use as a relay coil. Sensitive but low speed isolators are used. A capacitor and a resistor are used to filter out high frequency noise and leakage current rethe ground of the computer 107 can be isolated from that of the relay 106. The output of the opto-isolator 414 is buffered and inverted by inverters 417 and 418. The inverted and non-inverted signals are connected to two shift registers 418' and 420. The output of the shift registers 418' and 419 are ANDed by AND gates 421 and 422. The outputs of the AND gates 421 and 422 are connected to the J and K inputs of a flip flop 423. The shift registers 418' and 419 and the flip flop 423 are clocked by the high speed clock on the conductor 312. If the signal from the opto-isolator 414 is high for four consecutive clock pulses, the output of the flip flop 423 will go high. If the output is low for four consecutive clock pulses, the output of the flip flop 423 will go low. By consecutive sampling of the signal and making a change only after four samples all indicate a change, any noise on the input signal is removed and a noise-free signal is passed on to the computer interface circuit 11 on conductor 332.

The shaft position detector 105 uses the light reflecting band 102B on the shaft 102A of the generator to produce a pulse once every revolution of the generator shaft; light to the band 102B from the detector 105 and from the band to the detector is represented by the broken line shown at 102C in FIG. 1. The detector 105, as above noted, employs dual solid state light emitters 105A-105C in FIG. 1 and detectors 105B-105D to improve noise immunity in dirty or oily environments. It produces a five-volt pulse at least fifty microseconds wide on the conductor 307 in FIG. 1. Typically, the shaft position detector 105 includes surge protection and isolation electronics 105E in FIG. 1 to protect input and output circuits from operating improperly or being damaged by external high voltage, high frequency or high-current related spurious signals. The shaft detector 105 can be a shaft encoder equiped with a marker pulse (e.g., an encoder sold by Trump-Ross Industrial Controls of Wilmington, Mass.); or it can be an electromagnetic sensor and the marker 102B can be a metallic protuberance whose passage is sensed.

Referring now to FIGS. 12A and 12B, it can be seen that the contact circuits 17 and 18 of FIG. 2 are, in fact, solid state devices, that is, the thyristors 450 and 451, respectively, which serve to make and break the circuit between conductors 333A and 333B and 334A and 334B, respectively. The thyristor 450 constitutes the max-min contacts herein and the thyristor 451 constitutes the rate contacts herein; the circuits 17 and 18 are identical to one another. The thyristors 450 and 451 are gated by opto-thyristors 452 and 453, respectively, which are powered by the unregulated input 321 and are respectively triggered by an angle limit signal and a rate of angle limit signal on the conductors 300 and 301, respectively, from the angle limit circuit 5 and the rate of change of angle circuit 6, respectively.

Some comments of a general nature are contained in this paragraph, with regard to the operation and so forth of the power angle relay 106, with reference mostly to FIG. 2. The relay 106 receives on the conductor 308 a reference voltage normally in synchronism with the power system 101 and the generator 102 and on the conductor 307 an electric signal representative of the angular position of the shaft 102A (i.e., the band or mark 102B on the shaft periphery) of the synchronous alternator. The reference voltage and the electric signal are, in fact, combined in the phase angle measuring circuit 4 to provide an indication representative of the power angle between the direct axis of the synchronous alternator and its terminal voltage; that indication is in the form of multiple outputs on the conductors 319A–319J that are connected as inputs to the analyzing circuits 5, 6 and so forth in FIG. 2. In fact, most of the analyzing circuitry is in the blocks 5 and 6 and their outputs 300 and 301 not only supply information for the memory 10 but they supply, as well, information to the contact circuits or switch means 17 and 18, respectively, which, in turn, can activate alarms and even remove the alternator 102 from the system 101 in FIG. 1 in the event that the power angle or changes therein exceed predetermined limits. Among other things, maximum and minimum power angle limitations are established by the circuit 5 which provides an angle limit trip signal on the conductor 300 when either limitation is exceeded; the circuit 6 measures the rate of change of the power angle and provides a rate of angle limit trip signal on the conductor 302 when certain predetermined rates of change are exceeded. The precise signal inputs that are combined in the phase angle measuring circuit 4 are in actual fact conditioned by the input circuits 1, 2 and 3. Among the other outputs of the circuits 1 and 2 are the no-shaft position signal on the conductor 316 and the no-reference signal on the conductor 317, both signals being connected as inputs to the circuits 5 and 6 to prohibit generation of a trip signal from either when either the no-shaft position signal or the no-reference signal is present. Both the circuits 5 and 6 contain comparators by which the power angle is noted and the rate of change therein, as well as the limits thereof. The circuitry can be set to trip only if the limits are exceeded a plurality of times or when predetermined logical relationships exist between the various signals; these precautions, as well as the absence of the shaft position signals and/or the voltage reference, and others are included to reduce the possibility of false trip or other false indications.

Further modifications of the invention will occur to persons skilled in the art and all are deemed to be within the spirit and scope of the invention as defined by the appended claims.

What is claimed is:

1. A power angle relay to protect a synchronous alternator, that comprises, in combination, means to receive a reference voltage from some point in the power system to which the alternator is normally synchronized and an electric signal representative of the angular position of the shaft of the synchronous alternator and operable to combine the two to provide a power-angle signal representative of the power angle between the direct axis of the synchronous alternator and the reference voltage, means to process said power-angle signal to derive therefrom a measure of the power angle, means to compare the power angle with predetermined limits thereof, and means to provide an indication only in the event that the power angle exceeds the predetermined limits a plurality of successive times.

2. A power angle relay to measure the power angle of a synchronous alternator, that comprises means to receive a reference voltage from some point in the power system to which the alternator is normally synchronized and an electric signal representative of the angular position of the shaft of the synchronous alternator and operable to combine the two to provide an indication representative of the power angle between the direct axis of the synchronous alternator and the reference voltage, the reference voltage being derived from a reference voltage waveform, said relay further including signal conditioning circuitry to receive the reference voltage waveform and the electric signal representative of the angular position of the shaft and operable to provide electric outputs, a phase locked loop circuit connected to receive one of the outputs from the signal conditioning circuitry and a phase angle measuring circuit connected to receive another of the outputs from the signal conditioning circuitry as well as outputs of the phase locked loop circuit and operable to combine the same to provide said indication.

3. A power angle relay as claimed in claim 2 in which the phase angle measuring circuit provides said indication in the form of multiple outputs that are connected as inputs to further circuitry of the power angle relay.

4. A power angle relay as claimed in claim 3 wherein said further circuitry comprises angle limit circuit means that serves to establish maximum and minimum limitations on said power angle and to provide said indication as an angle limit signal when either limitation is exceeded.

5. A power angle relay as claimed in claim 3 wherein said further circuitry comprises rate of change of angle circuit means that serves to measure rate of change of said power angle and to provide said indication as a rate of angle limit signal when certain predetermined rates of change thereof are exceeded.

6. A power angle relay as claimed in claim 3 wherein said further circuitry includes display angle circuit means to provide an indication of said power angle and readout means that provides visual indication of the power angle.

7. A power angle relay to protect a synchronous alternator, that comprises, in combination, means to receive a reference voltage from some point in the power system to which the alternator is normally synchronized and an electric signal representative of the angular position of the shaft of the synchronous alternator and operable to combine the two to provide a power-angle signal representative of the power angle between the direct axis of the synchronous alternator and the reference voltage, means to process said power-angle signal to derive therefrom a measure of the power angle, means to compare the power angle with predetermined limits thereof, and means to provide an indication in the event that the power angle exceeds the predetermined limits, said relay further including memory means to permit storage of the history of the power angle.

8. A power angle relay as claimed in claim 3 that includes computer interface circuit means to permit input to the relay from a computer to permit monitoring and the like of said relay.

9. A power angle relay as claimed in claim 3 that includes switch means operable to provide said indication as an alarm output in the event that said power angle or changes therein exceeds predetermined limits.

10. A power angle relay as claimed in claim 3 that includes comparator means and in which the output of the phase-angle measuring circuit is connected as input to the comparator means where it is compared with a predetermined value, which comparator means generates said indication as a maximum-angle trip signal when the predetermined value is exceeded.

11. A power angle relay as claimed in claim 10 having a first circuit to detect absence of the shaft position detector signal and to provide a no-shaft position signal should that occur and a second circuit to detect absence of said reference voltage and to provide a no-reference signal should that occur, the first circuit and the second circuit being connected to prohibit generation of said trip signal when either the no-shaft position signal or the no-reference signal is present.

12. A power angle relay as claimed in claim 10 wherein the comparator means generates the maximum-angle trip signal only when the predetermined value is exceeded a plurality of successive times.

13. A power angle relay as claimed in claim 2 that includes rate of change of angle measurement means that provides an output representative of the rate of change of said power angle and comparator means, in which the phase angle measuring circuit is connected as input to the rate of change of angle measurement means whose output is connected as input to the comparator means where the rate of change of said phase-angle is compared with a predetermined value, which comparator means generates a maximum rate angle trip signal when the predetermined value is exceeded.

14. A power angle relay as claimed in claim 13 having a first circuit to detect absence of the shaft position detector signal and to provide a no-shaft position signal should that occur and a second circuit to detect absence of said reference voltage and to provide a no-reference signal should that occur, the first circuit and the second circuit being connected to prohibit generation of said trip signal when either the no shaft position signal or the no reference signal is present.

15. A power angle relay as claimed in claim 13 wherein the comparator means generates the maximum rate angle trip signal only when the predetermined value is exceeded a plurality of successive times.

16. A power angle relay as claimed in claim 2 that includes rate of change of angle measurement means that provides a signal indicative of rate of change of said power angle and comparator means, said phase-angle measuring circuit being connected as input to the rate of change of angle measurement means whose output is connected as a first input to the comparator means which receives a second input from the phase angle measuring circuit, the comparator means being operable to generate a trip signal when both the rate of change of said power angle and the power angle exceed predetermined values.

17. A power angle relay as claimed in claim 16 having a first circuit to detect absence of the shaft position detector signal and to provide a no-shaft position signal and a second circuit to detect absence of said reference voltage and to provide a no-reference signal, the first circuit and the second circuit being connected to prohibit generation of said trip signal when either the no-shaft position signal or the no-reference signal is present.

18. A power angle relay as claimed in claim 17 having memory means that continuously stores data representative of the power angle but which can be made to inhibit further storage and to retain the previous data.

19. A power angle relay as claimed in claim 18 wherein inhibition of further storage by the memory means is effected by either the no-shaft position signal or the no-reference signal.

20. A power angle relay as claimed in claim 19 that includes a manually operated means connected to permit inhibition of further storage by the memory means.

21. A power angle relay to measure the power angle of a synchronous alternator, that comprises means to receive a reference voltage from some point in the power system to which the alternator is normally synchronized and an electric signal representative of the angular position of the shaft of the synchronous alternator and operable to combine the two to provide an indication representative of the power angle between the direct axis of the synchronous alternator and the reference voltage, said relay having memory means that continuously stores data representative of power angle but which can be made to inhibit further storage and to retain the previous data.

22. A system to protect a synchronous alternator, that comprises, in combination: a shaft position detector that provides a shaft position signal with each rotation of the shaft of the alternator; means to provide a reference voltage derived from a voltage waveform from some point in the power system of which the alternator is normally synchronized; and a power angle relay connected to receive as inputs the shaft position signal and the reference voltage and that comprises a phase angle measuring circuit which uses said shaft position signal and said reference voltage to determine the power angle between the direct axis of the alternator and the voltage waveform and provide a power-angle signal representative of said power angle; and means to process the power angle signal, to compare the processed power-angle signal with predetermined limits therein, and to provide an indication only when one of said predetermined limits is exceeded a plurality of successive times to effect corrective action before an unstable condition is reached.

23. A system as claimed in claim 22 wherein the power angle determined is the time-phase relationship between the shaft position signal and each zero crossing of the voltage waveform and in which said means to provide measures said zero crossing.

24. A system as claimed in claim 22 in which the shaft position detector comprises a photoelectric emitter and sensor which are used in combination with a reference mark on the shaft to produce an electrical signal corresponding to the passing of the mark in front of the sensor.

25. A system as claimed in claim 24 in which the shaft position detector includes a plurality of photoelectric emitters and detectors whose outputs must be simultaneously generated to provide said shaft position signal.

26. A system as claimed in claim 24 wherein the shaft position detector includes surge protection and isolation electronics to protect input and output circuits thereof from operating improperly or being damaged by external high voltage, high frequency, or high-current related, spurious signals.

27. A system as claimed in claim 24 having a circuit to detect absence of the shaft position detector signal and adapted to generate a no-shaft position signal should that occur.

28. A system as claimed in claim 22 wherein said means to provide a reference voltage comprises a transformer to receive a voltage corresponding to said voltage waveform and serving to reduce the input voltage and provide isolation and wherein the power angle relay comprises an RC filter to reduce noise, a Schmidt trigger to detect zero crossing of the filtered signal and a digital multiple sampling scheme wherein the output of the trigger is sampled a plurality of times at a high-frequency rate and must be high or low a plurality of successive samples before said indication is rendered.

29. A system as claimed in claim 22 wherein the power angle relay includes a phase locked loop that is connected to receive said reference voltage or a reference-voltage signal representative of the reference voltage and is operable to generate a system clock signal which is an integer multiple of the power system frequency.

30. A system as claimed in claim 29 wherein the integer is chosen to correspond to a convenient subdivision of a period of the power system frequency.

31. A system as claimed in claim 29 wherein the phase-locked loop has loop dynamics such that it follows only slow changes in the power system frequency.

32. A system as claimed in claim 29 having a circuit to detect absence of said reference voltage and to provide a no-reference signal indicating the absence of the reference voltage.

33. A system as claimed in claim 32 wherein the no reference signal is used in conjunction with the phase-locked loop to maintain operation of the voltage controlled oscillator of the phase locked loop condition at or near its previous output frequency during the period that the reference voltage is absent.

34. A system as claimed in claim 29 that further includes a phase-angle measuring circuit comprising a counter which is reset by said reference voltage and the contents of which are sampled by the shaft position signal, the sampled contents being proportional to the power angle, said counter being clocked at a frequency which is greater than the frequency of the reference voltage.

35. A system as claimed in claim 34 wherein the frequency at which the counter is clocked is 360 times the reference frequency so that the contents of the counter can be read out directly in degrees.

36. A system as claimed in claim 34 wherein the counter is clocked by said clock signal derived from the phase-locked loop and, thus, the contents of the counter always reflect the time angle between the shaft position signal and the reference voltage irrespective of the frequency of the reference voltage.

37. A power angle relay as claimed in claim 7 that further includes switch means that, when activated, provides said indication and in which, in the event that the switch means is activated, the memory means is operable to store data placed therein just prior to activation of the switch means and just after such activation.

38. A power angle relay as claimed in claim 37 wherein the switch means comprises a first switch which, when activated, serves to trip the alternator from the power system and a second switch which, when activated, activates an alarm.

39. A power angle relay as claimed in claim 7 having switch means that, when activated, provides said indication, said switch means being operable to trip the alternator from the power system, means being provided to safeguard against false indications.

40. A power angle relay as claimed in claim 39 wherein the means to safeguard against false indications comprises: means to evaluate the power angle with respect to predetermined maximum and minimum allowable limits, means to evaluate changes in the power angle with respect to predetermined allowable changes therein, and means to assess whether the alternator is either in a stable condition or an unstable condition and, hence, whether the alternator should be respectively kept in the power system or tripped.

41. A system as claimed in claim 22 in which the power angle relay includes switch means which, when activated, provides said indication.

42. A system as claimed in claim 41 wherein the power angle relay further includes memory means that continuously stores data representative of the power angle but which can be made to inhibit further storage and to retain stored data.

43. A power angle relay as claimed in claim 1 wherein said means to process is further operable to measure changes in the power angle, wherein said means to compare is operable to compare changes in the power angle with predetermined limits thereof, and wherein said means to provide is operable to provide an indication in the event that the changes in the power angle exceed the predetermined limits in the changes in the power angle.

* * * * *